United States Patent
Ohlsson et al.

(10) Patent No.: US 10,236,178 B2
(45) Date of Patent: Mar. 19, 2019

(54) GALLIUM NITRIDE NANOWIRE BASED ELECTRONICS

(71) Applicant: HEXAGEM AB, Hjarup (SE)

(72) Inventors: Jonas Ohlsson, Malmö (SE); Mikael Bjork, Lomma (SE)

(73) Assignee: HEXAGEM AB, Hjarup (SE)

( * ) Notice: Subject to any disclaimer, the term of this patent is extended or adjusted under 35 U.S.C. 154(b) by 0 days.

(21) Appl. No.: 15/594,043

(22) Filed: May 12, 2017

(65) Prior Publication Data

US 2017/0316932 A1  Nov. 2, 2017

Related U.S. Application Data

(63) Continuation of application No. 14/378,063, filed as application No. PCT/IB2013/000640 on Feb. 12, 2013, now Pat. No. 9,653,286.

(Continued)

(51) Int. Cl.
*H01L 21/02* (2006.01)
*B82Y 10/00* (2011.01)
(Continued)

(52) U.S. Cl.
CPC .......... *H01L 21/0254* (2013.01); *B82Y 10/00* (2013.01); *B82Y 40/00* (2013.01); *H01L 21/0237* (2013.01); *H01L 21/0262* (2013.01); *H01L 21/02458* (2013.01); *H01L 21/02513* (2013.01); *H01L 21/02603* (2013.01); *H01L 21/02636* (2013.01); *H01L 21/02639* (2013.01); *H01L 21/02647* (2013.01); *H01L 21/30612* (2013.01); *H01L 27/0207* (2013.01); *H01L 27/0605* (2013.01); *H01L 27/085* (2013.01);

(Continued)

(58) Field of Classification Search
CPC .......... H01L 21/02458; H01L 21/0254; H01L 21/02389; H01L 21/02603; H01L 21/02636; H01L 21/02647; H01L 21/02513; H01L 29/2003; H01L 29/78681; H01L 29/0665; H01L 29/0669; H01L 29/0676; H01L 27/0605; H01L 2221/1094

See application file for complete search history.

(56) References Cited

U.S. PATENT DOCUMENTS

| 6,130,142 A | 10/2000 | Westwater et al. |
| 6,596,377 B1 | 7/2003 | Hersee et al. |

(Continued)

FOREIGN PATENT DOCUMENTS

| GB | 2 445 807 | 7/2008 |
| JP | 2006-332650 | 12/2006 |

(Continued)

OTHER PUBLICATIONS

International Search Report and Written Opinion dated Apr. 25, 2008, in PCT/SE2008/050036, 7 pages.

(Continued)

*Primary Examiner* — David Spalla
(74) *Attorney, Agent, or Firm* — The Marbury Law Law Group PLLC

(57) ABSTRACT

GaN based nanowires are used to grow high quality, discreet base elements with c-plane top surface for fabrication of various semiconductor devices, such as diodes and transistors for power electronics.

15 Claims, 19 Drawing Sheets

Related U.S. Application Data

(60) Provisional application No. 61/598,563, filed on Feb. 14, 2012.

(51) Int. Cl.
| | |
|---|---|
| B82Y 40/00 | (2011.01) |
| H01L 21/306 | (2006.01) |
| H01L 27/02 | (2006.01) |
| H01L 27/06 | (2006.01) |
| H01L 27/085 | (2006.01) |
| H01L 29/06 | (2006.01) |
| H01L 29/66 | (2006.01) |
| H01L 29/778 | (2006.01) |
| H01L 29/786 | (2006.01) |
| H01L 29/861 | (2006.01) |
| H01L 29/872 | (2006.01) |
| H01L 29/10 | (2006.01) |
| H01L 29/04 | (2006.01) |
| H01L 29/20 | (2006.01) |
| H01L 29/40 | (2006.01) |
| H01L 29/417 | (2006.01) |
| H01L 29/423 | (2006.01) |
| H01L 29/812 | (2006.01) |

(52) U.S. Cl.
CPC ...... *H01L 29/0676* (2013.01); *H01L 29/1075* (2013.01); *H01L 29/66462* (2013.01); *H01L 29/7786* (2013.01); *H01L 29/78642* (2013.01); *H01L 29/78681* (2013.01); *H01L 29/861* (2013.01); *H01L 29/872* (2013.01); *H01L 29/045* (2013.01); *H01L 29/0657* (2013.01); *H01L 29/2003* (2013.01); *H01L 29/402* (2013.01); *H01L 29/41758* (2013.01); *H01L 29/42316* (2013.01); *H01L 29/812* (2013.01)

(56) References Cited

U.S. PATENT DOCUMENTS

| | | | |
|---|---|---|---|
| 6,692,568 | B2 | 2/2004 | Cuomo et al. |
| 6,693,021 | B1 | 2/2004 | Motoki et al. |
| 6,709,929 | B2 | 3/2004 | Zhang et al. |
| 7,303,631 | B2 | 12/2007 | Conley, Jr. et al. |
| 7,309,621 | B2 | 12/2007 | Conley, Jr. et al. |
| 7,335,908 | B2 | 2/2008 | Samuelson et al. |
| 7,354,850 | B2 | 4/2008 | Seifert et al. |
| 7,445,742 | B2 | 11/2008 | Chen et al. |
| 7,821,022 | B2 | 10/2010 | Kim |
| 7,829,443 | B2 | 11/2010 | Seifert et al. |
| 8,309,439 | B2 | 11/2012 | Seifert et al. |
| 8,664,094 | B2 | 3/2014 | Seifert et al. |
| 8,691,011 | B2 | 4/2014 | Samuelson et al. |
| 8,891,011 | B2 | 4/2014 | Samuelson et al. |
| 9,024,338 | B2 | 5/2015 | Seifert et al. |
| 2003/0089899 | A1 | 5/2003 | Lieber et al. |
| 2003/0168964 | A1 | 9/2003 | Chen |
| 2003/0183160 | A1 | 10/2003 | Fujikura et al. |
| 2004/0075464 | A1 | 4/2004 | Samuelson et al. |
| 2004/0262636 | A1 | 12/2004 | Yang et al. |
| 2005/0011431 | A1 | 1/2005 | Samuelson et al. |
| 2005/0161662 | A1 | 7/2005 | Majumdar et al. |
| 2006/0008942 | A1 | 1/2006 | Romano et al. |
| 2006/0073680 | A1 | 4/2006 | Han et al. |
| 2006/0112466 | A1 | 5/2006 | Den |
| 2006/0125056 | A1 | 6/2006 | Samuelson et al. |
| 2006/0223211 | A1 | 10/2006 | Mishra et al. |
| 2006/0292055 | A1 | 12/2006 | Byeun et al. |
| 2007/0001220 | A1 | 1/2007 | Tombler, Jr. et al. |
| 2007/0041214 | A1 | 2/2007 | Ha et al. |
| 2007/0152353 | A1 | 7/2007 | Park |
| 2007/0172183 | A1 | 7/2007 | Wang |
| 2007/0238211 | A1* | 10/2007 | Wang ............ H01L 21/0242 438/47 |
| 2007/0257264 | A1 | 11/2007 | Hersee et al. |
| 2007/0286945 | A1 | 12/2007 | Lahnor et al. |
| 2008/0036038 | A1 | 2/2008 | Hersee et al. |
| 2008/0149946 | A1 | 6/2008 | Kim et al. |
| 2009/0079034 | A1* | 3/2009 | Wang ............ H01L 21/02609 257/615 |
| 2009/0169828 | A1 | 7/2009 | Hersee et al. |
| 2009/0301389 | A1 | 12/2009 | Samuelson et al. |
| 2010/0163840 | A1* | 7/2010 | Seifert ............ B82Y 10/00 257/13 |
| 2011/0127567 | A1* | 6/2011 | Seong ............ H01L 33/0079 257/99 |
| 2011/0140072 | A1* | 6/2011 | Varangis ............ B82Y 20/00 257/9 |
| 2011/0233521 | A1 | 9/2011 | Saxler |
| 2013/0072001 | A1 | 3/2013 | Seifert et al. |

FOREIGN PATENT DOCUMENTS

| | | |
|---|---|---|
| JP | 2008-034483 | 2/2008 |
| JP | 2008-547235 | 12/2008 |
| JP | 2010-515651 | 5/2010 |
| WO | WO 2008-048704 | 4/2008 |
| WO | WO 2008-079077 | 7/2008 |
| WO | WO 2008-085129 | 7/2008 |
| WO | WO 2010-023921 | 3/2010 |
| WO | WO 2011-067872 | 6/2011 |

OTHER PUBLICATIONS

Bertness et al., "Catalyst-Free Growth of GaN Nanowires," Journal of Electronic Materials, 2006, 35(4):576-580.

Dailey et al., "Vapor-liquid-solid growth of germanium nanostructures on silicon," Journal of Applied Physics, Dec. 15, 2004, 96(12):7556-7567.

Hersee et al., "The Controlled Growth of GaN Nanowires," Nano Letters, 2006, 6(8):1808-1811.

Kipshidze et al., "Controlled growth of GaN nanowires by pulsed metalorganic chemical vapor deposition," Applied Physics Letters, 2005, 86:033104-1 to 033104-3.

Liang et al., "Selective-Area Growth of Indium Nitride Nanowires on Gold-Patterned Si(100) Substrates," Applied Physics Letters, Jul. 1, 2002, 81 (1): 22-24.

Ma et al., "Small-Diameter Silicon Nanowire Surfaces," Science, Mar. 21, 2003, 299:1874-1877.

Mohan et al., "Controlled growth of highly uniform, axial/radial direction-defined, individually addressable InP nanowire arrays," Nanotechnology, 2005, 16:2903-2907.

Mohan et al., "Realization of conductive InAs nanotubes based on lattice-mismatched InP/InAs core-shell nanowires," Applied Physics Letters, 2006, 88:013110-1 to 013110-3.

Pan et al., "Single-crystal growth of metallic nanowires with preferred orientation," Nanotechnology, 2005, 16:1559-1564.

Qian et al., "Core/Multishell Nanowire Heterostructures as Multicolor, High-Efficiency Light-Emitting Diodes," Nano Letters, 2005, 5(11):2287-2291.

Su et al., "Catalytic Growth of Group III-Nitride Nanowires and Nanostructures by Metalorganic Chemical Vapor Deposition," Applied Physics Letters, 2005, 86: 013105-1 through 013105-3.

Supplementary Partial European Search Report for EP 13 74 9940, dated Aug. 6, 2015, 10 pages.

Fundling, S. et al, "Three-Dimensionally Structured Silicon as a Substrate for the MOVPE Growth of GaN NanoLEDs," Phys. Status Solidi A, vol. 206, No. 6, pp. 1194-1198, (2009).

Akasaka et al., "GaN Hexagonal Microprisms with Smooth Vertical Facets Fabricated by Selective Metalorganic Vapor Phase Epitaxy," Appl. Phys. Lett. 71 (15), Oct. 1997.

Beaumont et al., "Magnesium Induced Changes in the Selective Growth of GaN by Metalorganic Vapor Phase Epitaxy," Applied Physics Letters, vol. 72, No. 8, Feb. 1998.

(56) References Cited

OTHER PUBLICATIONS

Hiramatsu et al., "Recent Progress in Selective Area Growth and Epitaxial Lateral Overgrowth of III-Nitrides: Effects of Reactor Pressure in MOVPE Growth," Phys. Stat. Sol. (a) 176, 535, (1999).
Sears, G.W., "A Mechanism of Whisker Growth," Acta Metallurgica, vol. 3, Jul. 1955.
Xia et al., "One-Dimensional Nanostructures: Synthesis, Characterization, and Applications," Adv. Mater., Mar. 2003, 15, No. 5.
First Office Action, dated Dec. 21, 2010, Chinese Patent Application No. 200880002009.9, State Intellectual Property Office, P.R. China.
Japanese Office Communication for JP No. 2014-556149, dated Nov. 25, 2016, 4 pages.
International Search Report for PCT/IB2013/000640.

\* cited by examiner a)
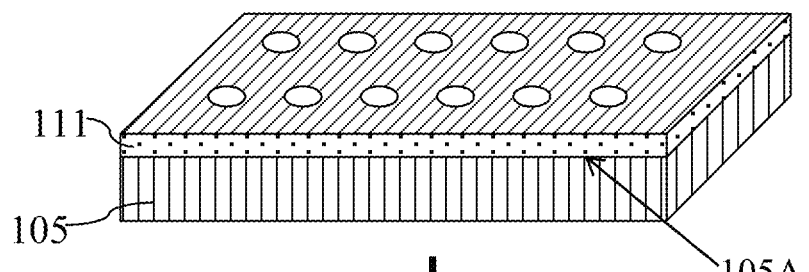
b)
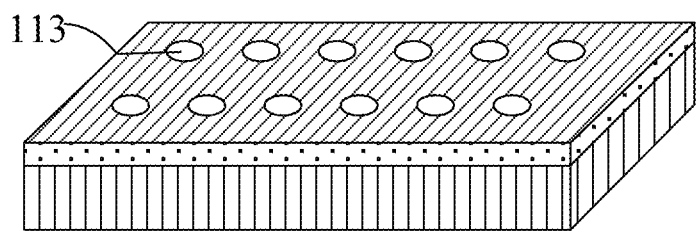
c)
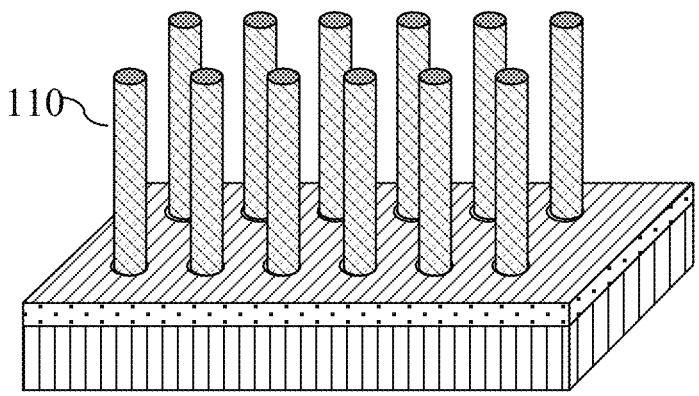
*Fig. 2a*

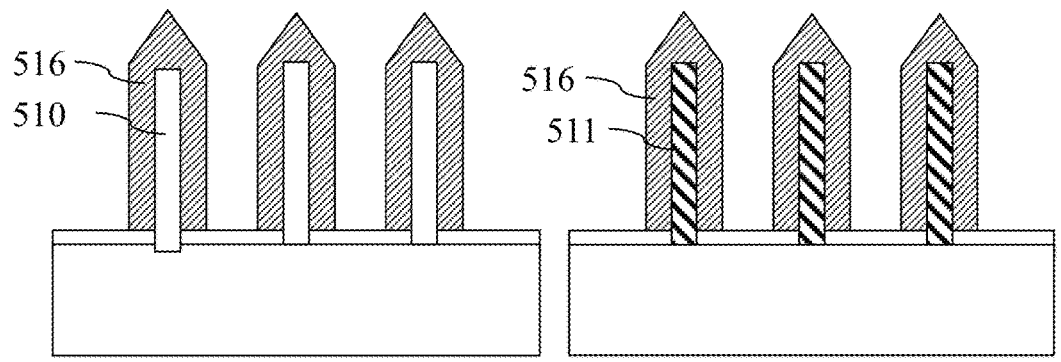
*Fig. 5a*    *Fig. 5b*
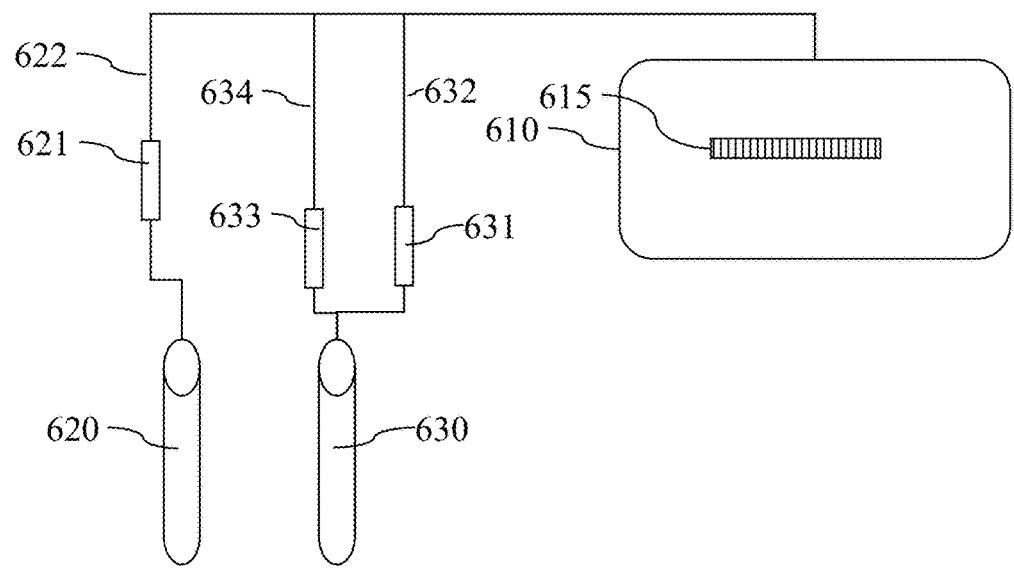
*Fig. 6*

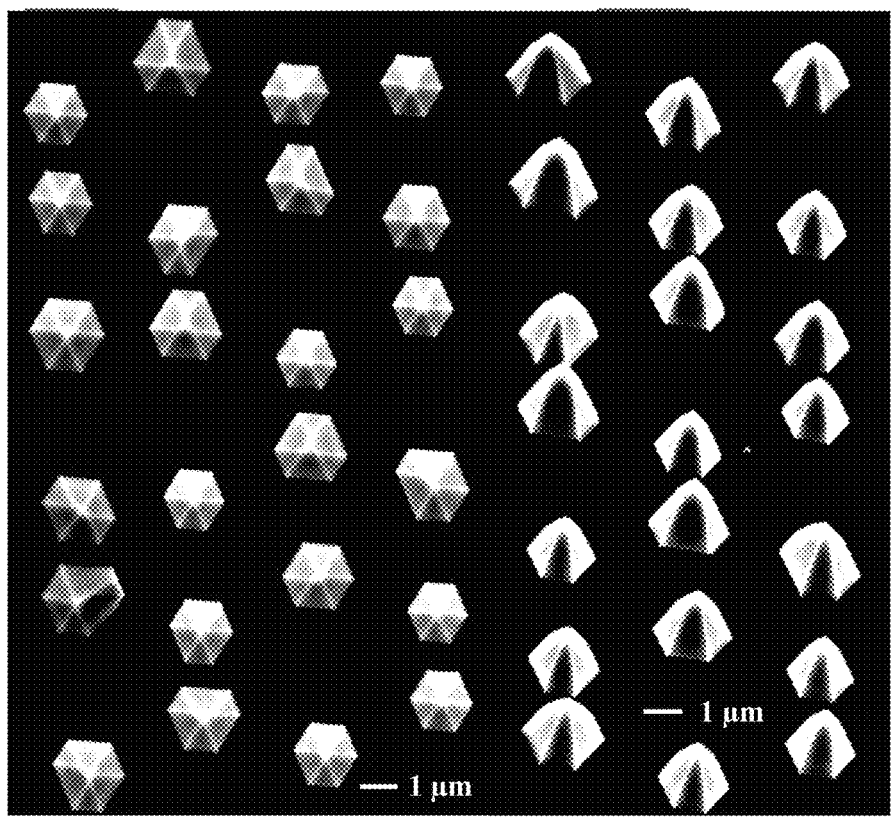
*Fig. 7a-b*
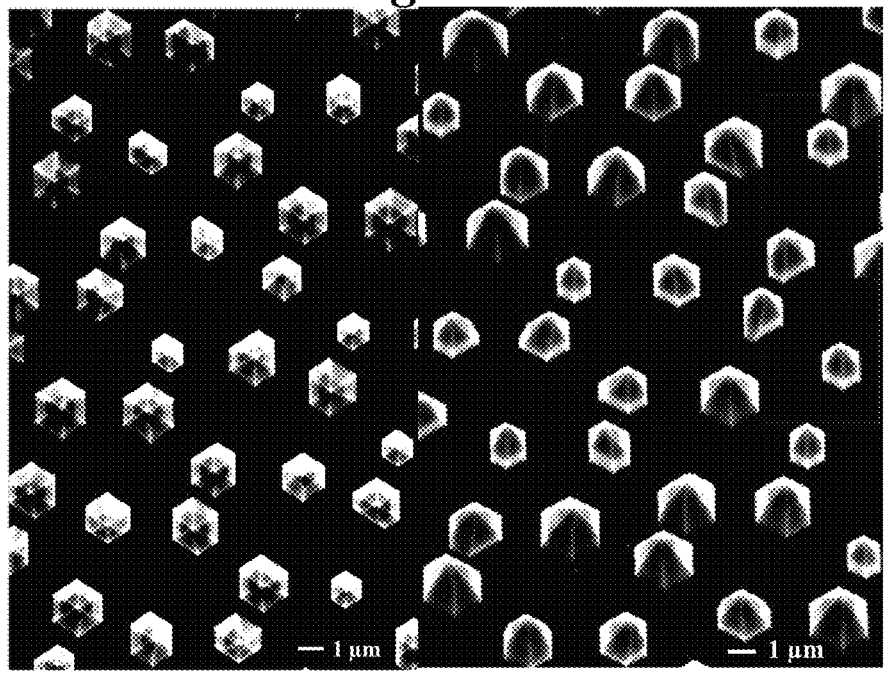
*Fig. 8a-b*

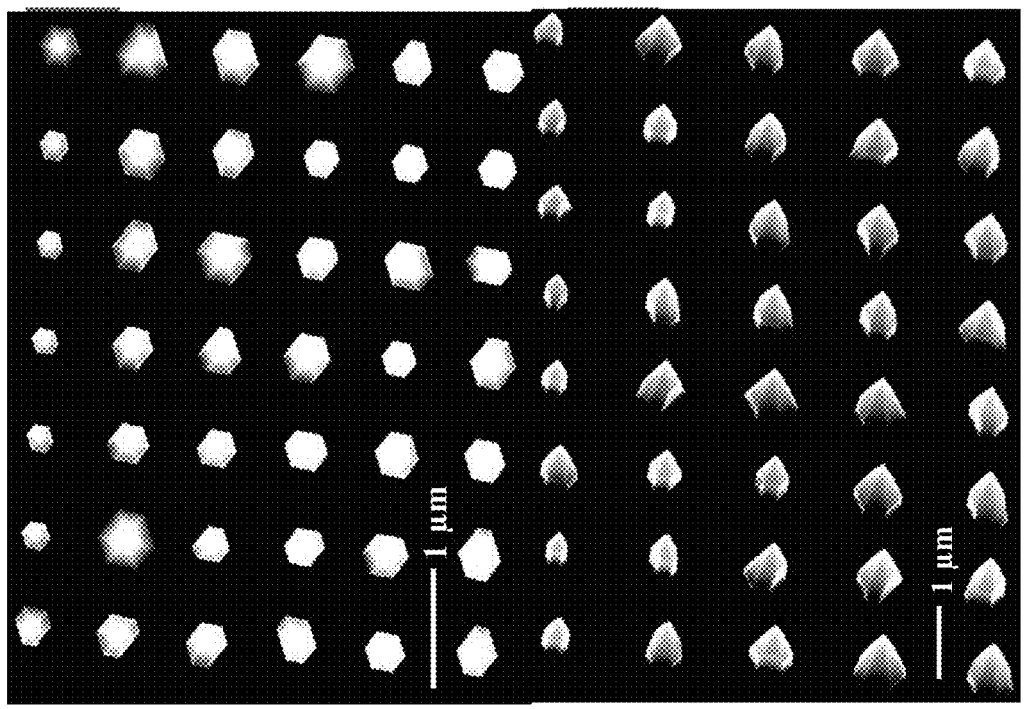
*Fig. 9a-b*
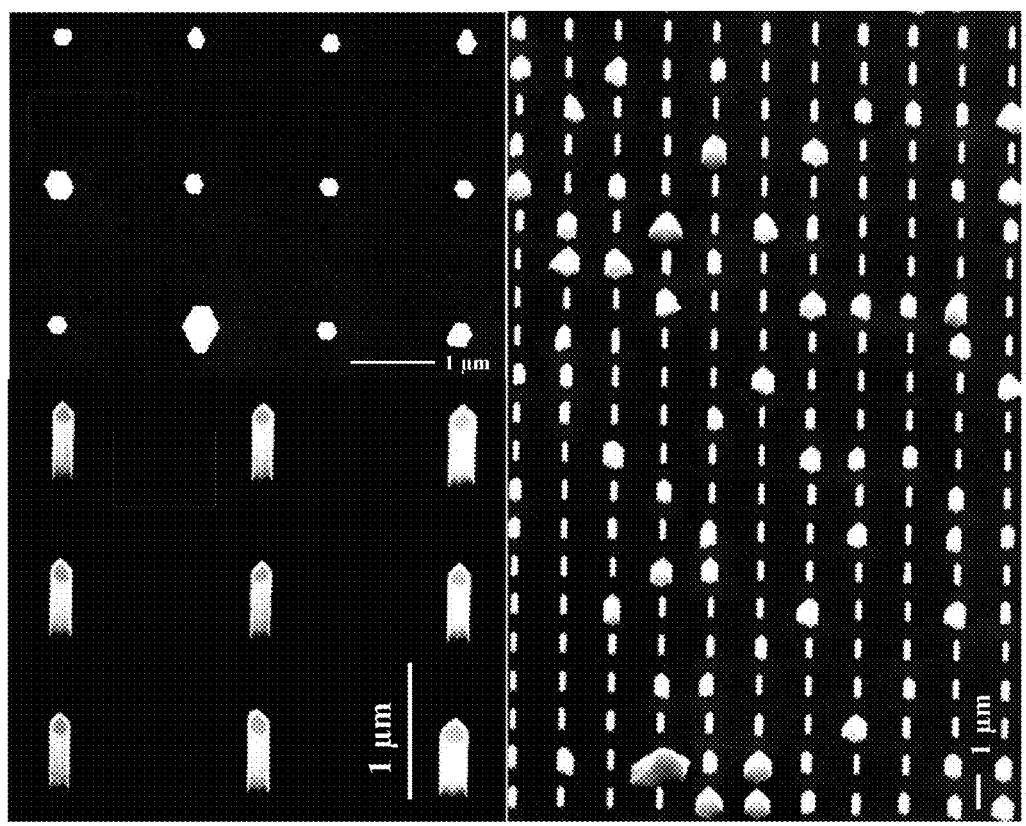
*Fig. 10a-c*

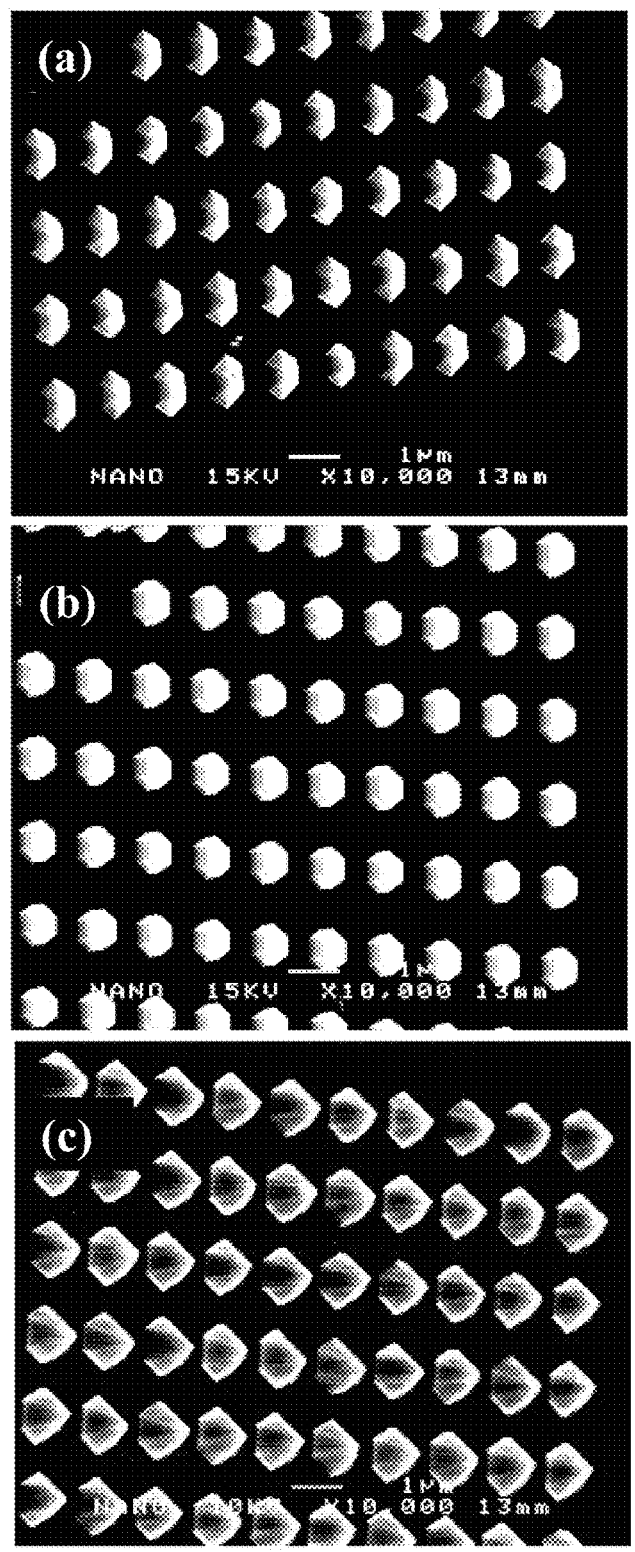
Fig. 11a-c

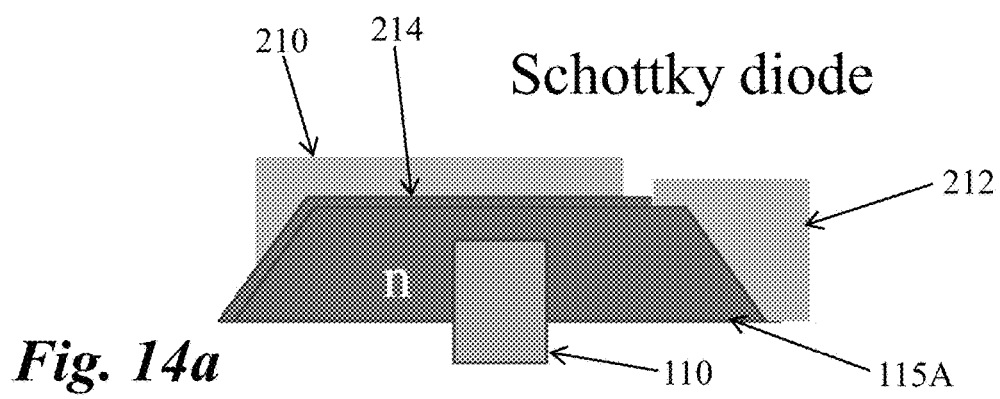
Fig. 14a  Schottky diode
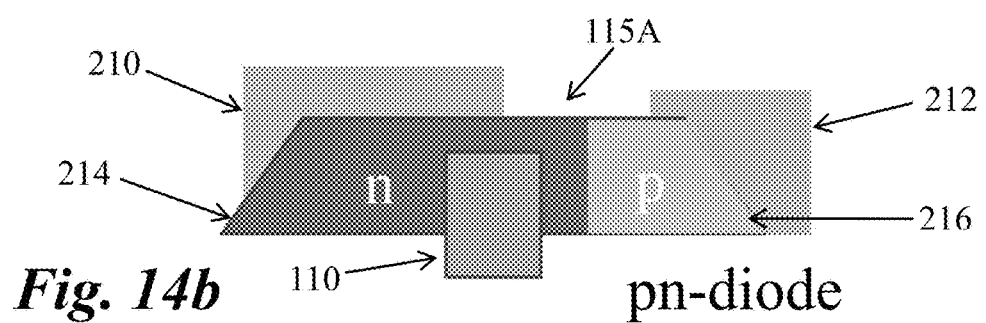
Fig. 14b  pn-diode
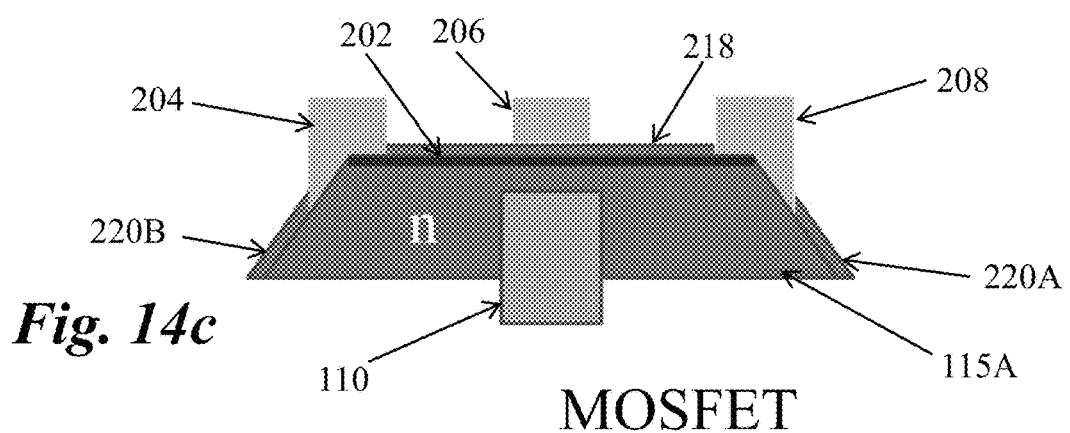
Fig. 14c  MOSFET

*Fig. 15B*
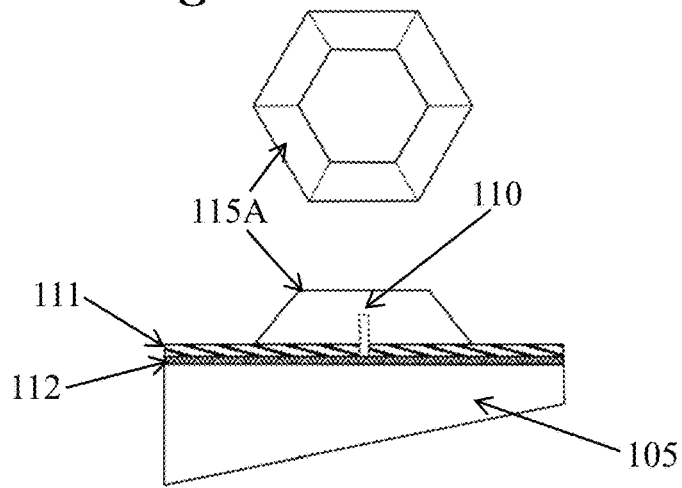
*Fig. 15A*
*Fig. 15E*
*Fig. 15D*
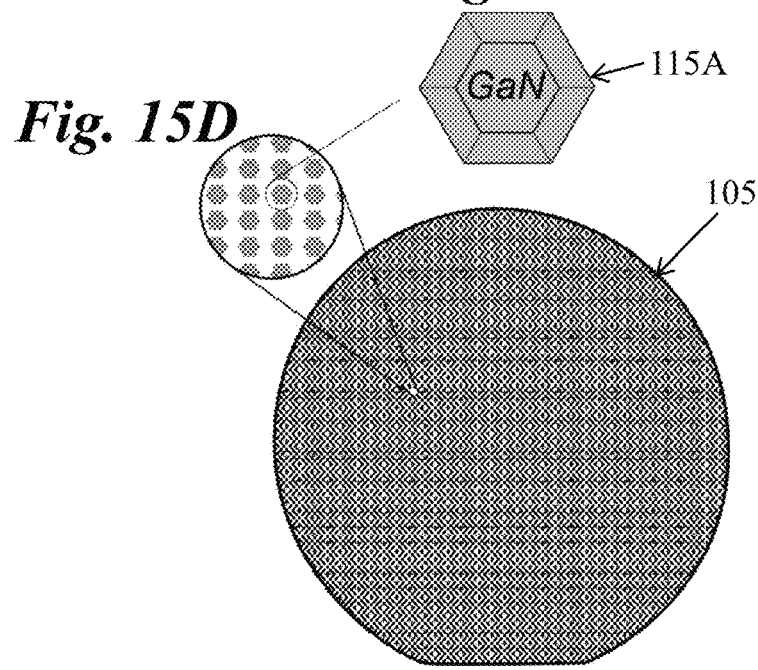
*Fig. 15C*

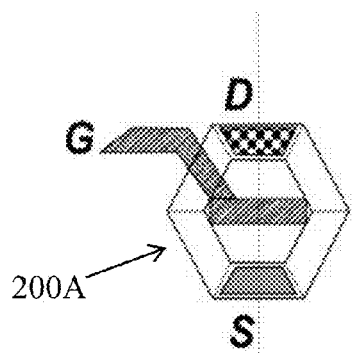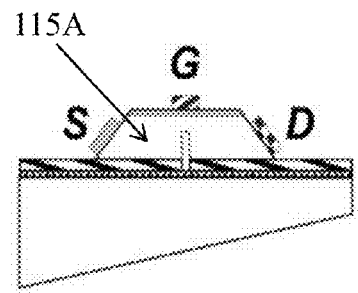
*Fig. 18A*  *Fig. 18B*
"HEMT"
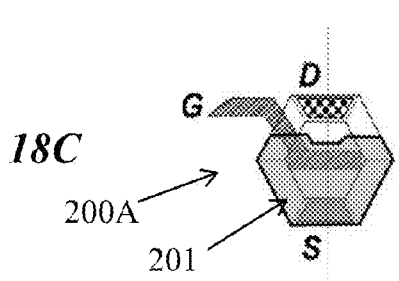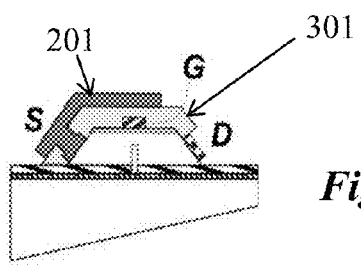
*Fig. 18C*  *Fig. 18D*
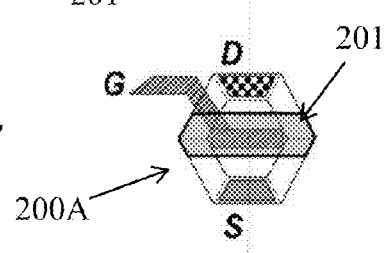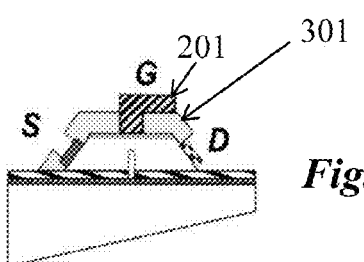
*Fig. 18E*  *Fig. 18F*
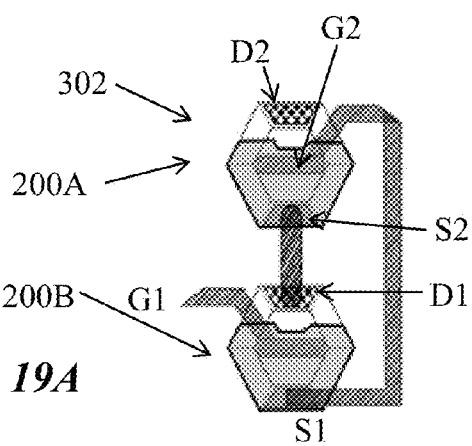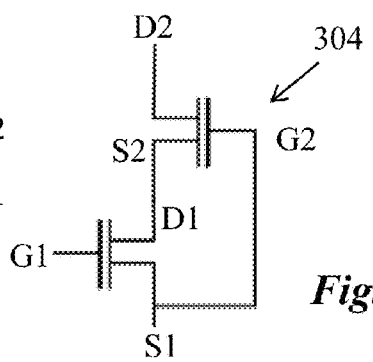
*Fig. 19A*  *Fig. 19B*
"Cascode"

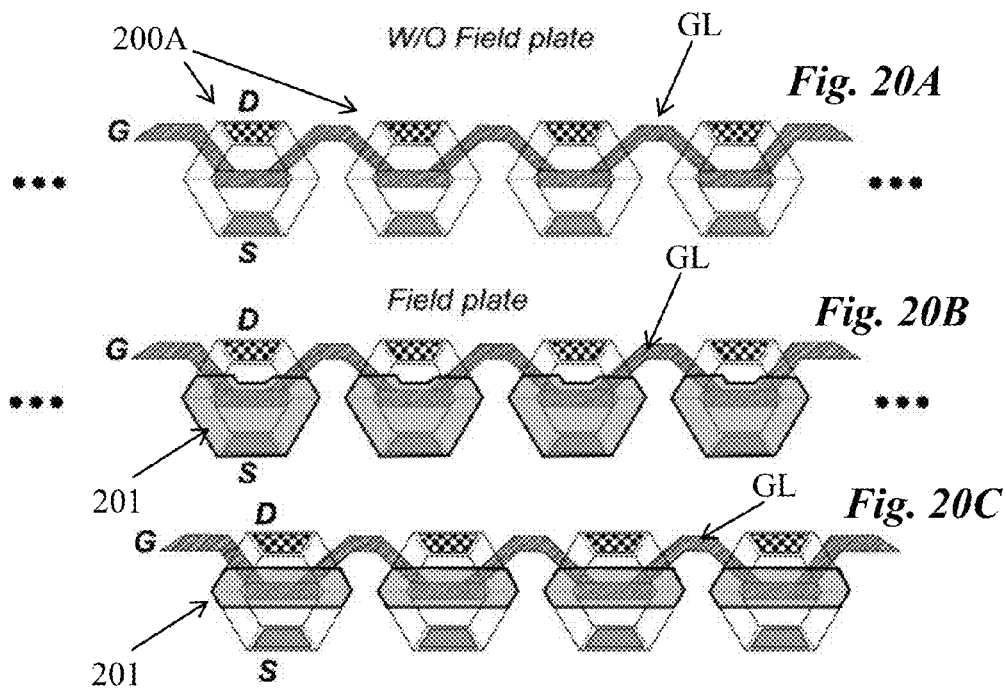
*Fig. 20A*
*Fig. 20B*
*Fig. 20C*
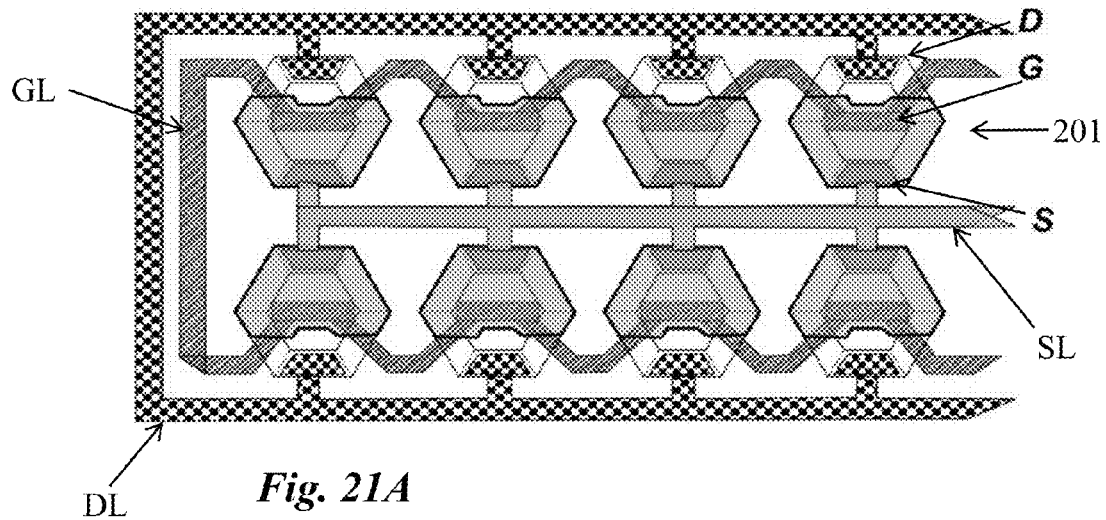
*Fig. 21A*
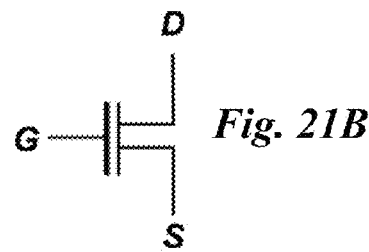
*Fig. 21B*

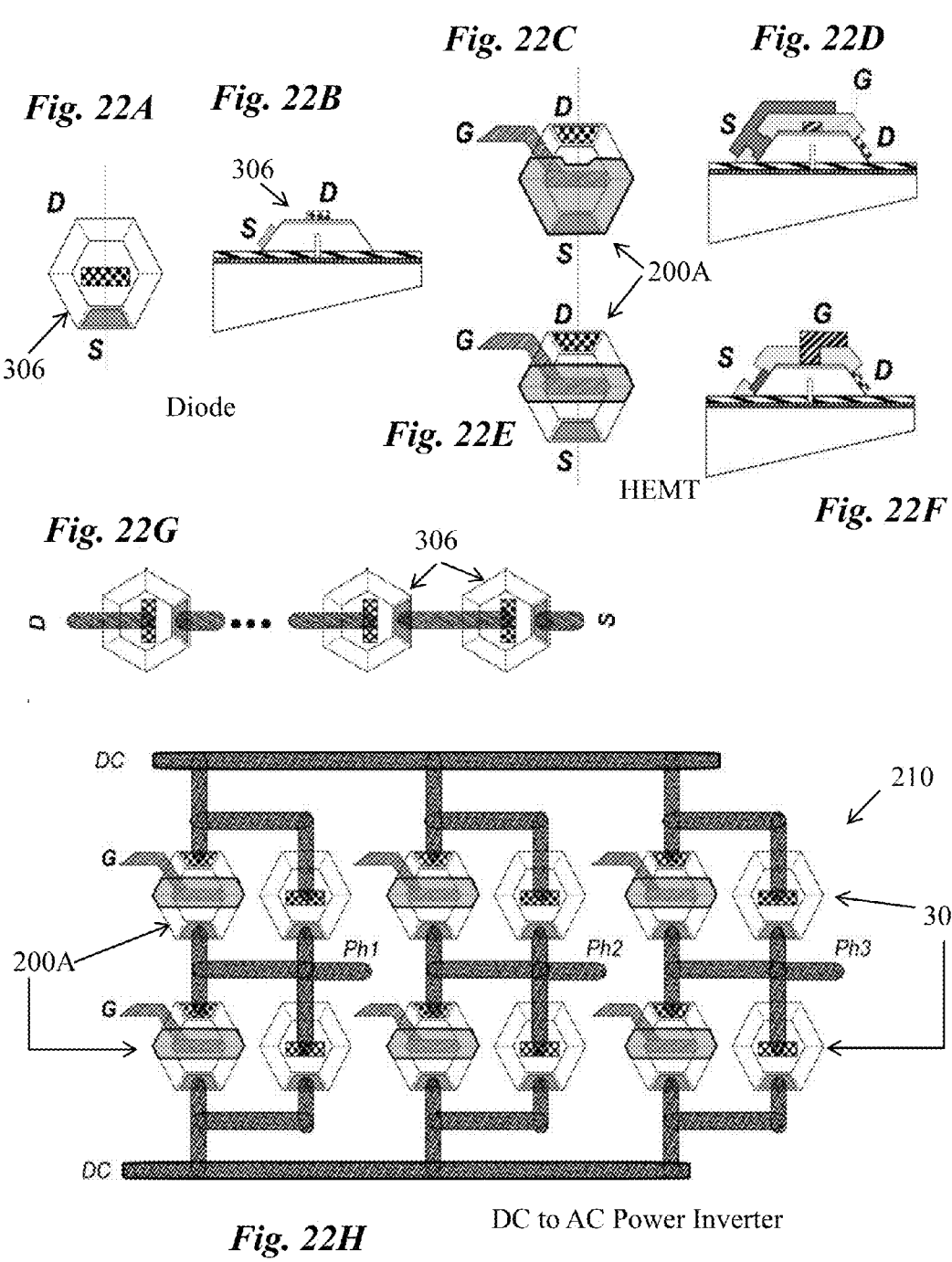

GALLIUM NITRIDE NANOWIRE BASED ELECTRONICS

FIELD OF THE INVENTION

The present invention relates to semiconductor devices, such as power and RF electronics, based on nitride semiconductor nanowires and the method of producing such.

BACKGROUND

Gallium nitride (GaN) based transistors include GaN/AlGaN HEMT (high electron mobility transistor) or HFET (heterojunction field effect transistor) structures, comprising 2DEG (two dimensional electron gas). Theoretically GaN material brings superior properties to the table, with better electron mobility (speed, efficiency) and better high voltage ability than both Si and SiC. GaN power and RF technology includes AlGaN/GaN HEMTs and schottky diodes. However, GaN technology of today is generally higher in cost than Si technology and generally inferior in material quality and high voltage reliability than SiC technology. This due to the use of foreign substrates necessitated by inability to fabricate sufficient production levels of GaN native substrates at commercially viable cost levels. Thus, the major limits of GaN electronics technology boils down to material crystal dislocations and wafer production costs related to minimization of dislocations originating from growth on foreign substrates.

Misfit dislocations, in form of threading dislocations, formed in nitride layers produced by conventional methods (heteroepitaxial growth) lower the operating voltage ability of power electronic devices and decrease the reliability of the devices. The addition of a buffer layer between the substrate and the nitride (device) layer reduces the number of defects. Typically this gives defect densities of $10^{-8}$-$10^{-9}$ $cm^{-2}$ for GaN growth on SiC, slightly higher for GaN growth on sapphire substrates and $10^{-9}$-$10^{-10}$ $cm^{-2}$ for GaN on Si. However, deposition of the buffer layer increases the cost of the devices. A thicker buffer layer provides higher device quality than a thinner buffer layer. This can be achieved by longer growth times, but longer growth times increase the cost of the device. Further, the addition of a thick buffer layer may induce wafer bow due to lattice mismatch between the substrate and the buffer layer.

GaN films are typically grown by industrial scale MOCVD techniques. To achieve acceptable quality of the films the growth is performed with high precursor flow such as $NH_3$ and TMG (trimethylgallium), and hence high partial pressures. A commonly used measure is the so called "V/III-ratio" which relates the molar flow of the precursor elements, for example the molar ratio between the $NH_3$ and TMG. The V/III-ratio used for GaN film growth is in the range of 1000-10000.

Top standard GaN films of today do still have very high densities of defects. Under such background, 1-dimensional structures, that is nanowires based on nitrides have attracted plenty of attentions from researchers. Several methods such as VLS, template-confinement growth, and oxide-assisted growth have been reported for GaN nanowires growth.

Additionally, an insulating/non-conducting buffer layer could be used to prevent individual nanodevices from short circuiting with their neighbors. Shorts between individual devices rule out on-chip multiple device circuitries. Non conducting or semi insulating substrates are advantageous for RF applications. Threading dislocations, generally enhancing n-type properties in GaN, limits the possibility to make semi insulating buffer material.

Selective area growth of GaN has also been studied extensively from 1990's to reduce the dislocations density in GaN films. From dot-patterned GaN openings, Akasaka et al. showed GaN columns growth with the diameter of 5 µm. Recently, Hersee et al. reported array fabrication of GaN wires using selective area growth. It is described that pulsed growth had to be used for growing GaN nanowires to confine the lateral growth. Pulsed growth is also referred to as migration enhanced growth. The method may be described as a two step method comprising an initial nanowire growth step referred to as a selective growth step wherein both precursor gases are provided. The initial growth step is followed by a secondary step of pulsed growth, wherein precursor gases are provided one at the time.

SUMMARY OF THE INVENTION

An embodiment relates to a method of making a semiconductor device including forming a plurality of semiconductor nanowires over a substrate, forming a semiconductor volume element on each nanowire, planarizing each volume element to form a plurality of discreet base elements having a substantially planar upper surface and forming a device in each of the plurality of base elements.

Another embodiment relates to a semiconductor device including an insulating growth mask located over a substrate, a plurality of III-nitride semiconductor nanowires protruding from openings in the growth mask and a plurality of discreet III-nitride semiconductor mesas. Each of the plurality of mesas is located around and over each of the plurality of the nanowires and each mesa has a substantially planar c-plane upper surface. The device also includes at least one electrode located over each semiconductor mesa.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE DRAWINGS

Preferred embodiments of the invention will now be described with reference to the accompanying drawings, wherein:

FIG. 2a illustrates schematically the method according to the embodiments of the invention and FIG. 2b is a flowchart over the method according to the embodiments of the invention.

FIGS. 4, 12 a-d and 13 a-d illustrate schematically a method of making a device according to the embodiments of the invention.

FIGS. 5a-b illustrate schematically embodiments of a nanostructured LED device according to the embodiments of the invention.

FIG. 6 illustrates schematically a nanowire growth apparatus according to the embodiments of the invention.

FIGS. 7a-b are SEM-images illustrating the result of growth conditions not giving nanowires.

FIGS. 8a-b are SEM-images illustrating the result of growth conditions wherein nanowires are starting to form.

FIGS. 9a-b are SEM-images illustrating the result of growth conditions giving nanowires.

FIGS. 10a-c are SEM-images illustrating the result of growth conditions giving nanowires.

FIGS. 11a-c are SEM-images illustrating the effects of source doping.

FIGS. 14a-c are schematic diagrams of a) a Schottky diode, b) a p-n diode and c) a MOSFET that can be made according to the embodiments of the invention.

FIGS. 15A-15E illustrate an embodiment of a nanowire enabled power wafer according to an embodiment.

FIGS. 18A-18F illustrate alternative HEMT embodiments.

FIGS. 19A-19B illustrate an embodiment with two HEMTs in a cascode configuration.

FIGS. 20A-20C illustrate alternative embodiments in which multiple HEMTs are connected with a common gate line.

FIGS. 21A-21B illustrate an embodiment in which multiple HEMTs are configured with common gate lines, common source lines and common drain lines.

FIGS. 22A-22H illustrate a DC to AC power inverter 210 and its components according to an embodiment.

DETAILED DESCRIPTION

The semiconductor device and method to produce such device comprises at least one nitride semiconductor nanowire, for example a GaN nanowire.

III-nitride semiconductor based diodes (e.g., Schottky diodes) and transistors (e.g., MOSFETs, HEMTs or HEFTs) can be formed using many different methods and may have many different designs. Dimensions, sequences, and incorporation of other material, (dopant atoms, incorporation and amount of indium, etc.) are varied. Dielectrics, such as $Al_2O_3$ and $SiO_2$ are applied in between electrodes and may be formed under the gate electrode of a metal oxide semiconductor HEMT (MOSHEMT). For normally-off devices the gate is often recessed through AlGaN into GaN, interrupting the AlGaN/GaN 2DEG. The device descriptions below are not intended to be exhaustive in any way but only used as clarifying examples. Nitride based electronic devices are limited by crystal defects, mainly from threading dislocations as misfit dislocations from growth on mismatched substrates. This is true independent of device fabrication technique and design. As will be described below, the embodiments of the invention provide improved crystal quality III-nitride based, such as GaN based device layer growth templates or buffers, and implement insulation between devices already on wafer level, improving power and voltage tolerances, life and performance of nitride based devices.

Figure 1:
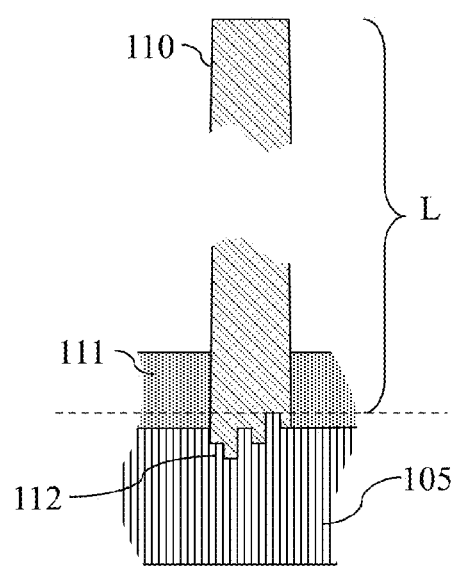
FIG. 1 illustrates schematically a nanowire according to the embodiments of the invention.

A nitride semiconductor nanowire 110, which is schematically illustrated in FIG. 1, is in this context defined as an essentially rod-shaped structure with a diameter less than 1 micron, such as 500 nm and a length up to several µm. The nanowire 110 is at its base epitaxially connected to a substrate 105, which may comprise of epitaxial layers, for example a layer of GaN closest to the nanowire 110. The nanowire 105 protrudes through an opening in a growth mask 111 of for example $SiN_x$ or another insulating layer. As indicated in FIG. 1 the surface of the substrate 105 may exhibit some roughness 112, exaggerated in the figure, for illustrative purposes only. Hereinafter the term nanowire should be understood as referring to the structure not restricted by the surface roughness, i.e., the nanowire begins in the first atomic layer above the substrate 105, or alternatively worded in the first "free" layer. This first layer of nanowire 110 will however typically be within the opening of the growth mask 111. The length of the nanowire is denoted L.

Nitride nanowires produced with prior art techniques typically comprises a large number of defects. The above referred pulsed selective growth represents a significant improvement, but the method may produce stacking faults close to the base of the nanowire. Typically a nanowire produced with such method will have a variation from a cubic to a hexagonal crystal structure close to the base. A semiconductor device comprising a plurality of such nanowires will have a substantial portion of, or all, nanowires exhibiting this type of defects. Stacking faults have effects on the physical properties of the nanowire as regard to optical and electrical properties. In for example a LED application also the relatively small distortion introduced by a stacking fault close to the base may impede the performance since the stacking fault increase the electrical resistance. Since the area is very small, the increased resistance may have significant influence on the performance of the LED.

The nitride semiconductor nanowire according to an embodiment of the invention has the same crystal structure throughout its entire length, i.e., the nanowires do not exhibit stacking fault close to the base. Preferably the crystal structure is hexagonal. Nanowires with the same crystal structure throughout their length can be produced with the below described method.

The semiconductor device according to an embodiment of the invention begins with nanowires 105 each with the same crystal structure throughout the entire length of the nanowire. A majority of the plurality of nanowires should have only one crystal structure. Even more preferably at least 90% of the nanowires of a semiconductor device each have the same crystal structure. Even more preferably 99% of the nanowires of a semiconductor device each have the same crystal structure.

The method of growing nitride semiconductor nanowires according to one non-limiting embodiment of the invention utilizes a CVD based selective area growth technique. A nitrogen source and a metal-organic source are present during the nanowire growth step and at least the nitrogen source flow rate is continuous during the nanowire growth step. The V/III-ratio utilized in the inventive method is significantly lower than the V/III-ratios commonly associated with the growth of nitride based semiconductor.

The method can be implemented by metal organic chemical vapor deposition (MOCVD) processes and apparatuses therefore. The method can also be implemented by other CVD and vapor phase epitaxy (VPE), such as hydride VPE or metal organic VPE (MOVPE) based processes with modifications that should be obvious for the skilled person. The method is illustrated schematically in FIG. 2a and by the flowchart of FIG. 2b, and comprises the steps of:

a) Providing a growth mask 111 on a major surface (e.g., top surface) 105A of a substrate 105. The substrate may be any suitable material for growing III-nitride nanowires, for example a GaN, silicon, sapphire or AlN wafer which may optionally contain one or more buffer layers, such as a GaN buffer layer on a silicon substrate. The growth mask 111 is preferably a dielectric layer, such as $SiN_x$ or $SiO_x$. However, other materials may be used b) Produce openings 113 in the growth mask. The openings are preferably well controlled, both in regards to their diameter and their relative positioning. Several techniques known in the art can be used for the procedure including, but not limited to electron beam lithography (EBL), nanoimprint lithography, optical lithography and reactive ion etching (RIE) or wet chemical etching methods. Preferably the openings are approx 100 nm in diameter and pitched 0.5-5 µm apart. The openings define the position and the diameter of the nanowires 110 to be produced.

c) Nanowire growth by a CVD or MOVPE based process. Preferably, a plurality of III-nitride semiconductor nanowires are formed extending substantially perpendicular to the major surface 105A of the substrate 105 (e.g., extending exactly perpendicular or within 10 degrees of a normal to surface 105A). Preferably, the precursor source flows are continuous during nanowire formation. The precursor source flow rates are adjusted to achieve a low supersaturation in the growth zone. The V/III-ratio should be in the range 1-100, preferably in the range 1-50, and even more preferably in the range 5-50. It should be noted that this V/III-ratio is considerably lower than the ratios used for film growth.

Figure 3A:
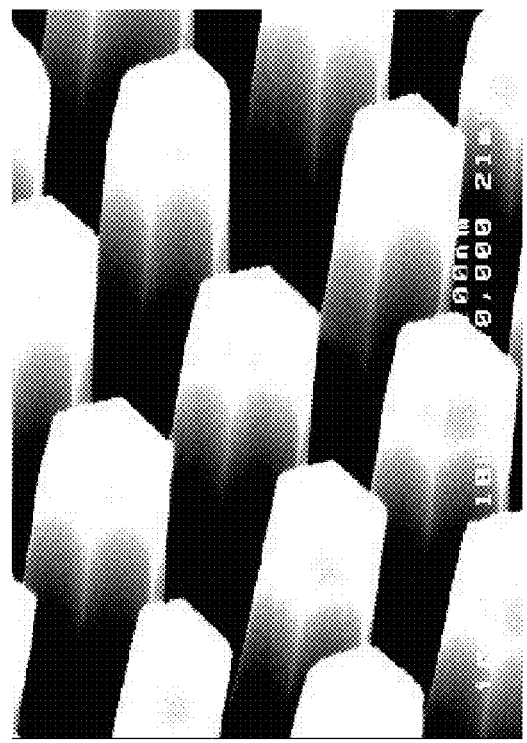
FIGS. 3a-b are SEM images of nanowire structures according to the embodiments of the invention.
Figure 3B:
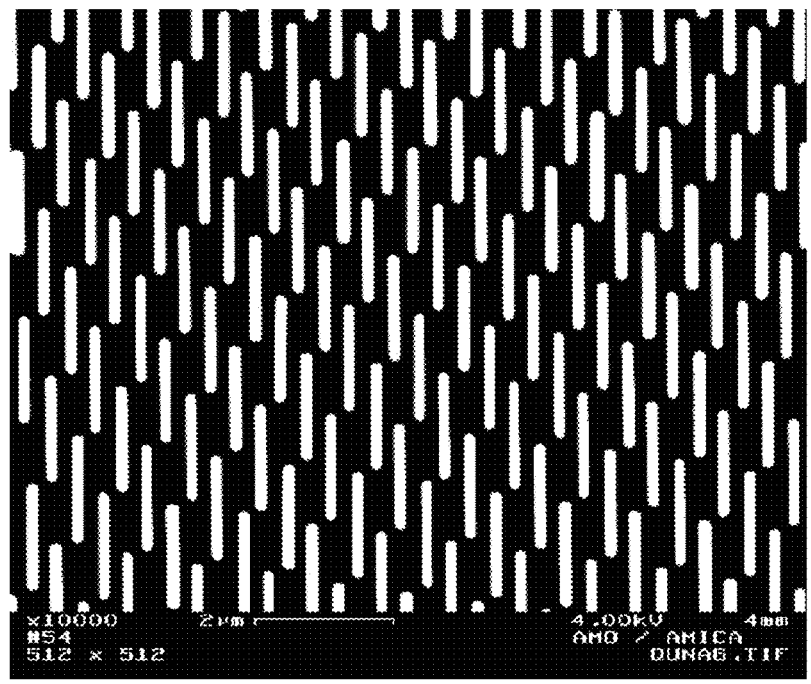

Nanowires fabricated with the above method are illustrated in the SEM images of FIGS. 3a-b. On the starting substrate layer of $SiN_x$ (30 nm in thickness) was deposited by PECVD. In a subsequent step, arrays of dot-patterned GaN openings (around 100 nm in diameter) were made by electron beam lithography, EBL, and reactive ion etching, RIE. The pitch between the openings was ranged as 0.5-3.2 µm, giving a growth mask that defines both the diameters and the positions of the nanowires. Then, the as-processed samples were inserted into a horizontal MOCVD chamber to grow GaN nanowires. FIG. 3a illustrates further that nanowires with a pyramidal ending can be formed, which is advantageous for certain applications.

The method may comprises various steps for enhancing the growth conditions, illustrated as a pretreatment step c'), for example an annealing prior to the nanowire growth step c). The pretreatment step may comprise a plurality of substeps. It should be noted that the pretreatment step according to the embodiments of the invention does not result in nanowire growth, although one or more of the precursors could be used for the pretreatment, for example annealing. Also a variation of the V/III ratio during the nanowire growth step c) can be envisaged. However, the flow of the precursor materials should not be disrupted during the nanowire growth step.

The nanowires can be used in many different applications. The nanowires can be used as structural building blocks used to form coalesced, discreet islands of high quality GaN, which can have a very low defect density. How continuous coalesced layers are formed from nanowires are described by Samuelson et al. in U.S. application Ser. No. 10/613,071, incorporated herein by reference in its entirety.

Figure 4:
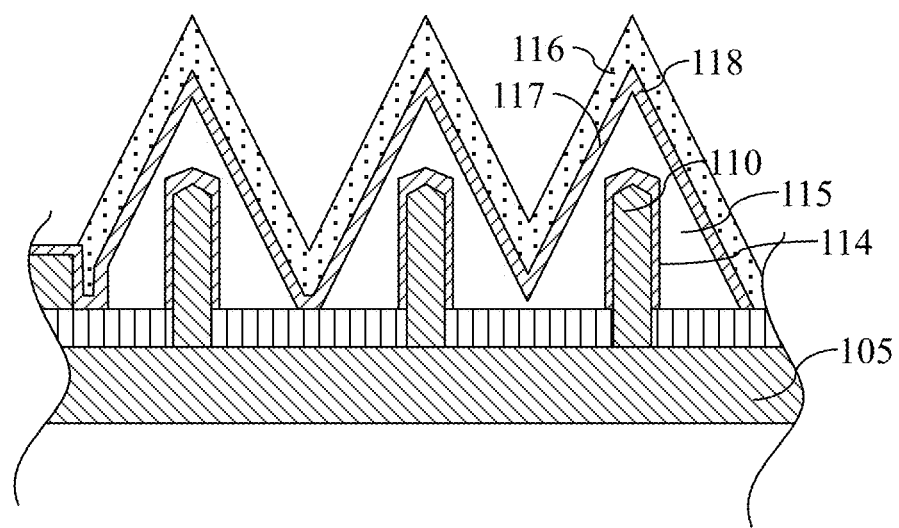

An in-process device comprising a semiconductor nanowire according to the embodiments of invention is schematically illustrated in FIG. 4. The device comprises a substrate 105, wherein the nanowire 110 has been epitaxially grown from the substrate 105. A portion of the nanowire 110 is enclosed by an optional shell 114 and a volume element 115. The volume element 115 is preferably epitaxially connected to the nanowire 110. The nanowire 110 typically has a diameter in the order of 50 nm to 500 nm, and the volume element a width in the order of 200-700 nm. The volume element 115 may have different shape than the nanowire. As illustrated in FIG. 4, the nanowire 110 is enclosed by a pyramidal overgrowth forming the volume element 115. Similar to above the pyramidal overgrowth may comprise a plurality of layers 116, 117, 118 if desired.

According to one embodiment of the method of the invention further growth steps are included that provides the overgrowth, or volume element on the nanowire. The method, as described with references to the flowchart of FIG. 2b, comprises two phases. The first phase that can be considered as a nanowire growth phase, comprising the steps a-c) where nanowire growth conditions, i.e., the low V/III-ratio, are provided. In the second phase the nanowires are overgrown by the volume element 115, which may comprise a plurality of different layers, in a CVD-based process similar to the growth process in the first phase and preferably in a same growth chamber, but with growth parameters adjusted for planar growth, i.e., with a V/III-ratio that is higher than in the nanowire growth, typically in the order of 1000. The method according to the embodiment may be seen as a nanowire growth phase followed by a planar growth phase, or lateral growth phase. The nanowire growth phase producing nanowires with surfaces that are near ideal for planar growth, since the side walls of the nanowires will be non-polar, so called m-planes, {1-100}. Such surfaces are extremely hard to produce by conventional methods. In the planar growth phase, or lateral growth phase, following the nanowire growth phase, the ideal surfaces are utilized for the growth of the shell layers in step d), and one or more optional steps e), f), etc., forming parts of the device.

The method steps of making a device are illustrated in FIGS. 12 a-d. FIG. 12a illustrates the GaN nanowire 110 protruding through the mask 111 similar to step c) in FIG. 2a. Continuous selective growth of nanowires is expected to reduce device dislocation densities in two ways: first by decreased growth area, as known in ELO (epitaxial lateral overgrowth), and second by early rejection and ejection of dislocations from the nanowire as a means to release the additional strain energy the threading dislocation invokes on the nanowire. Such relaxation is not possible in bulk layers since a threading dislocation needs a surface or a second dislocation to dissolve. As a side-effect of nanowire growth conditions, the nanowire is prone to comprise varying amounts of impurities, vacancies and substitutional defects, increasing n-doping but decreasing electron mobility. Thus, in the embodiments of the present invention the nanowire core is not relied on for electrical use (e.g., not relied on for being incorporated into the active portion of a device) nor for insulation, but is used as a filter for one kind of defects.

Figure 12A:
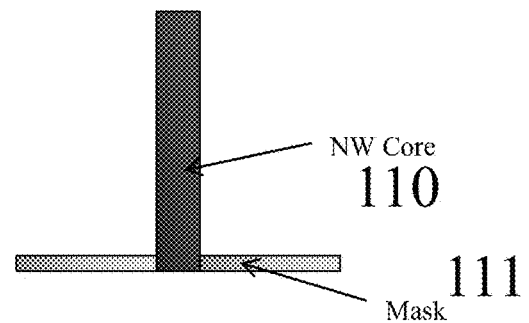
FIGS. 12a-d are schematic diagrams illustrating a method of making a pyramidal volume element with an additional single crystal semiconductor epitaxial layer according to an embodiment.
Figure 12B:
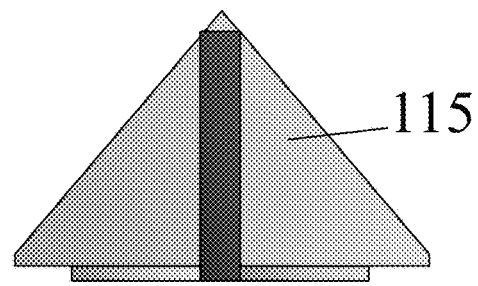

FIG. 12b illustrates the growth (i.e., nanowire overgrowth) of the GaN pyramidal volume element 115, similar to FIG. 4. This element or layer is grown at conditions similar to planar GaN, greatly improving crystal purity and stoichiometry as compared to the nanowire core by decreasing impurities, vacancies and substitutional defects. Preferably, for reasons clarified below, this volume element or layer may be grown as an intrinsic, low doped (i.e., dopant content below than $10^{16}$ cm$^{-3}$) or, even compensation doped (i.e., doped with Fe, C or both n-type and p-type dopants to reduce material conductivity) to behave as a semi-insulating semiconductor material. Normally, sufficiently semi-insulating GaN for such use is not viable over small dimensions due to the inability to efficiently compensate for unintentional n-doping originating from high dislocation and defect densities. However, since a high majority of the volume elements are dislocation free, high resistivity levels above $10^5$ ohm*cm (e.g., $10^6$ to $10^7$ ohm*cm) can be achieved. If excellent stoichiometry can be achieved, then even higher resistivity of $10^7$ ohm*cm and higher such as above $10^9$ ohm*cm (e.g., $10^7$ to $10^{12}$ ohm-cm, such as $10^9$ to $10^{11}$) may be achieved.

Figure 12C:
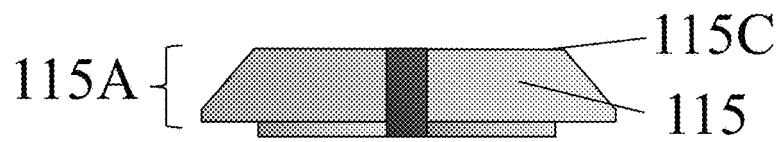

FIG. 12c illustrates a planarization, such as an in-situ etch back of the pyramidal volume element 115 and optionally the nanowire 110 to form a base element 115A with a planar upper surface 115C having a c-plane orientation. "c-plane" represents a {0001} plane. Preferably, the upper part of the nanowire is removed during the planarization step. However, in alternative embodiments, the planarization stops at or above the nanowire if the volume element 115 extended above the nanowire 110 to a sufficient height. The etch back may be performed by chemically or temperature assisted anisotropic etching or chemical mechanical polishing, The base element 115A forms a mesa with a planar upper c-plane surface and sloped sidewalls extending to the mask layer 111. For volume elements 115 that have a shape other than pyramidal, the sidewalls of the base element 115A may be straight rather than sloped. Base elements fabricated by this method may range in width from 0.1 μm to 100 nm, preferably the width range from 1 μm to 50 μm. The choice of width is preferably controlled through the spacing of the openings 113 (shown in FIG. 2a) in the mask 111 for the nanowires 110 together with growth parameters and growth time of the described layers.

Figure 12D:
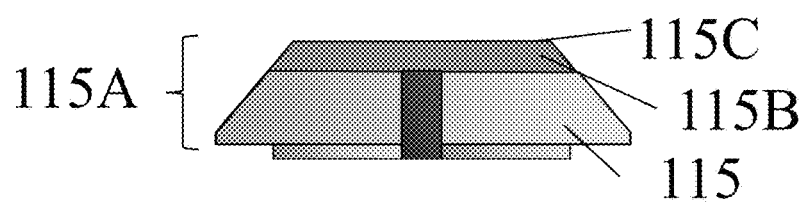

FIG. 12d illustrates the deposition of an additional single crystal semiconductor epitaxial layer 115B (referred to as a displacing layer herein) on the c-plane surface. Preferably, the upper surface of layer 115B also has a c-plane orientation. The upper surface of layer 115B is removed or displaced from the nanowire core 110 to avoid having any non-uniformity in the surface due to the nanowire core 110 top exposed in the surface of the planarized volume element. Thus, the active device surface is electrically displaced from the nanowire core since the displacing layer 115B may be grown in a similar manner as the volume element, also taking advantage of dislocation free crystallinity, high resistivity levels of $10^6$ ohm*cm or higher (e.g., $10^6$ to $10^7$ ohm*cm) can be achieved. If excellent stoichiometry can be achieved, then even higher resistivity of $10^7$ ohm*cm and higher, such as above $10^9$ ohm*cm (e.g., $10^7$ to $10^{12}$ ohm-cm, such as $10^9$ to $10^{11}$) may be achieved.

Layer 115B may be a GaN layer, a ternary or quaternary layer (e.g., AlGaN), or a sequence of such layers which can be epitaxially deposited on the planarized GaN volume element to form a displaced base element 115A where the upper surface 115C of the base element is located above the upper tip of the nanowire 110. If present, the top surface of layer 115B forms the planar upper surface 115C having a c-plane orientation of the displaced base element 115A. The layer 115B segments are preferably grown to exhibit high stoichiometry (substantially 50 atomic percent nitrogen and substantially 50 atomic percent Group III material with a deviation of 0.5% or less). In this way the nanowire segment 110 filters out crystal dislocations, while the displacing layer 115B and the planarized volume element 115 enhances crystal purity, resulting in a high purity layer without dislocations. Although not shown, the displacing layer 115B is grown on all facets of the mesa 115A exposed during the growth step. The pyramidal facets tend to grow slower than the c-plane surface, though resulting in appreciably thinner layers.

Furthermore, it is important to note that, by this method, the displacing layer 115B and the planarized volume element 115 form a fully or semi-insulating base element 115A, such that the entire upper surface of the mesa comprising the base element is electrically displaced from the nanowire core 110. Preferably, the steps illustrated in FIGS. 12a-12d are carried out in one uninterrupted growth run (e.g., without breaking vacuum or unloading the wafers in single chamber or multi-chamber semiconductor manufacturing apparatus).

Preferably, the substantially planar c-plane upper surface 115C of the base element mesa 115A (i.e., the upper surface of the displacing layer 115B or the upper surface of the planarized volume element 115 if the displacing layer 115B is omitted) is substantially free of threading dislocations. For example, the substantially planar c-plane upper surface of the base element mesa 115A has less than $10^9$ threading dislocations, such less than $10^8$, less than $10^7$, less than $10^6$, less than $10^5$, e.g., between $10^4$ and $10^9$ threading dislocations and all of the subranges in the between. In another example, at least 90%, such as 90-99% of the base element mesas 115A have no threading dislocations in their substantially planar c-plane upper surfaces.

The base element 115A provides a singular semi-insulating template for subsequent device layers, providing the possibility to fabricate low defect, high purity, semi-insulating mesas suitable for growth and fabrication of pre-partitioned devices on substrates 105 irrespective of whether the substrate is electrically conductive, insulating or of semiconducting. Alternatively, the displacing layer 115B may be omitted and fabrication of the active device may continue directly on the planarized volume element 115 portion of the base element 115A shown in FIG. 12c, when device layer insulation from the semiconductor volume element 115 and nanowire 110 is not critical.

In summary, the nanowire core 110 works as a filter for defects from the substrate or buffer layer (e.g., layer on substrate 105), such as threading dislocations and substrate NW interface defects. This method allows nanowires to be grown on high thermal conductivity, insulating and semi-insulating substrates 105 (e.g., carbon films, semi-insulating silicon, SOI (silicon on insulator), sapphire, etc.) that are suitable for power electronic devices (e.g., diodes, transistors such as MESFETs and bipolar transistors, rectifiers, thyristors, HEMTs etc.) which utilize the properties of the c-plane and generate appreciable amounts of heat. Alternatively, the substrate 105 may be a conductive substrate (e.g., metal) or a semiconductor substrate (e.g., silicon, GaN, etc.), while the base element 115A comprises an electrically insulating or semi-insulating III-nitride semiconductor buffer (e.g., a GaN or AlGaN mesa) suitable for epitaxial growth of single crystal or high quality polycrystalline III-nitride semiconductor active device layers.

Theoretical electron mobility in GaN is fairly high, but RF properties of high purity GaN devices, as described herein are still limited due to the lack of a decent semi-insulating substrate. The ability to grow these devices on semi-insulating, or insulating substrates enables improved high frequency functionality in accordance with the potential given by GaN electron mobility. Polarity of c-plane (the surface used in planar technology) is used in order to create 2DEG channel in GaN HEMT technology. 2DEG in HEMTs are formed by heterostructure band bending between AlGaN and GaN. Electron mobility in 2DEGs may easily exceed the theoretical mobility of GaN.

Figure 13A:
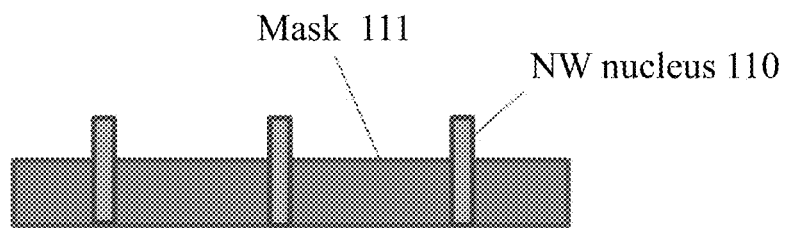
FIGS. 13a-d are schematic diagrams illustrating a method of making a transistor according to an embodiment.
Figure 13B:
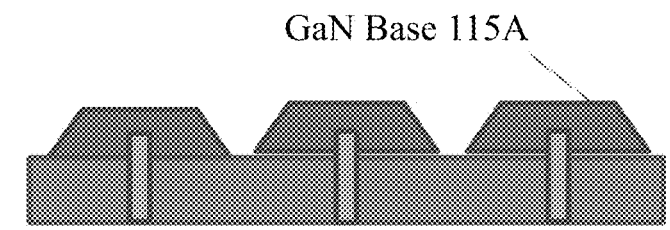
Figure 13C:
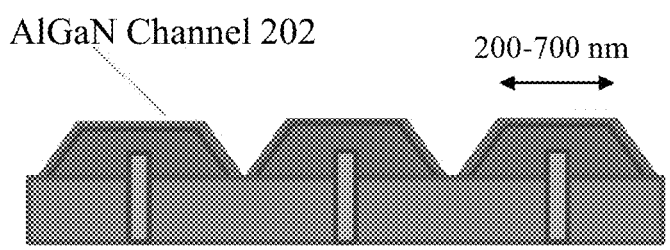

FIGS. 13a-d illustrate a method of forming a transistor (e.g., MESFET or HEMT) according to the method of FIGS. 12a-d. FIGS. 13a and 13b correspond to FIG. 12a, and 12d, respectively, FIG. 13c shows one or more active device layers 202 that may comprise the displacing layer 115B or may comprise additional single crystal or high quality polycrystalline semiconductor layer(s) which are epitaxially grown on the base element 115A (e.g., on the displacing layer 115B or directly on the planarized volume element 115), in which case the base element comprises a buffer structure (e.g., mesa with substantially planar upper surface) for epitaxial growth of the semiconductor active device layer(s) 202. Note that device layer 202 covers all facets of the mesa 115A exposed during the growth step. This is true of all active layers 202 and displacing layer 115B but different facets will result in different layer thicknesses. Usually, for simplicity, the pyramidal (side) facets are not shown in the figures as they tend to grow slower than the c-plane surface, resulting in appreciably thinner layers.

The high purity and quality active device layer(s) 202 preferably has an impurity content of less than $5\times10^{16}$ cm$^{-2}$ excluding intended p-type or n-type dopants. In other words, if layer 202 is intentionally doped, then excluding the intentionally added dopant atoms, the layer 202 has less than $5\times10^{16}$ cm$^{-2}$ undesired impurities, such as less than $10^{16}$ cm$^{-2}$, less than $10^{15}$ cm$^{-2}$, less than $10^{14}$ less than $10^{13}$ cm$^{-2}$, less than $10^{12}$ cm$^{-2}$, for example $10^{12}$ cm$^{-2}$ to $10^{16}$ cm$^{-2}$ undesired impurities and all subranges in between. The device layer(s) 202 is also substantially free of threading dislocations. For example, layer 202 has less than $10^9$ threading dislocations, such as less than $10^8$, less than $10^7$, less than $10^6$, less than $10^5$, e.g., between $10^4$ and $10^9$ threading dislocations and all of the subranges in the between. In another example, at least 90%, such as 90-99% of layers 202 on the mesas 115A have no threading dislocations.

Figure 13D:
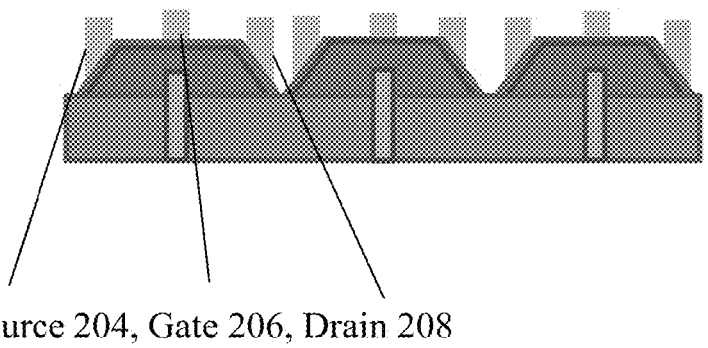

FIG. 13d illustrates the formation of source 204, gate 206 and drain 208 electrodes on the AlGaN active layer 202 (e.g., a layer which comprises at least a portion of a channel region of a transistor). In a HEMT structure, the electrodes will be in connection with and acting on electrons in an AlGaN/GaN 2DEG (two dimensional electron gas). A MESFET may comprise an AlGaN layer or a GaN layer 202 over a semi-insulating GaN or AlGaN layer that may comprise the displacing layer 115B or an additional layer located over the base element 115A. Thus, the embodiments of the invention are expected to improve nitride MESFET performance due to the high quality semi-insulating layers, as comprised in the described base element 115A. Since each base element 115A is electrically isolated (by virtue of an insulating substrate 105) and/or insulated (by virtue of it being semi-insulating or insulating irrespective of the conductivity of the substrate 105) from adjacent base elements, a single device (e.g., diode, transistor, etc.) may be formed in or on each base element 115A.

FIGS. 14a-c illustrate other devices (Schottky diode, p-n diode and MOSFET, respectively) that can be formed on the base element 115A. To form the Schottky diode shown in FIG. 14a, the nanowire seed 110 and the base element 115A are formed as discussed above, although the volume element 115 is preferably a doped semiconductor, such as an n-doped semiconductor, rather than an insulating or semi-insulating III-nitride material. This forms a semiconductor base element 115A. Next, the Schottky barrier layer 214 is formed by depositing low doped III-nitride semiconductor material on the base element 115A. A first electrode 210 is then formed on layer 214 and a second electrode 212 is formed in a selectively formed opening in layer 214 on surface of the base element 115A. Alternatively the base element may be semi-insulating, followed by the growth of a device layer 202 on the semi-insulating base element, formation of a first electrode 210 of a material that forms a Schottky interface with the device layer 202, and formation of a second electrode 212 of a material that forms an ohmic contact to the device layer 202.

To form the pn-diode shown in FIG. 14B, the nanowire seed 110 and the base element 115A are formed as discussed above. Then, a first portion 214 of the base element 115A is masked and the unmasked, second portion 216 of the base element 115 is ion implanted with ions of an opposite conductivity type used when forming the base element 115A. For example, if the base element 115A is formed with n-type material, the unmasked, second portion 216 of the base element 115A may be ion implanted with acceptor ions until it is p-type. The mask is then removed. A first electrode 210 may then formed on the first portion 214 of the base element 115A and a second electrode 212 formed on the second portion 216 of the base element 215A.

To form the MOSFET shown in FIG. 14C, the nanowire seed 110 and the base element 115A are formed as discussed above. A gate dielectric layer 218 is then formed over the top surface of the base element 115A. Optionally, a channel region 202 can be formed by ion implantation and annealing of a top portion of the base element 115A. Ion implantation may be performed with ions having the same or different conductivity type as regions 115A. To form the gate electric layer 218, the side portions of the base element 115A where the source and drain contacts will be formed may be masked and dielectric material deposited over the unmasked top and side edge regions of the base element 115A. Alternatively, the entire base element 115A may be covered with a layer of dielectric material, the top and side edge regions are masked, and dielectric material removed from the sides of the base element 115A to form the gate dielectric 218 and insulating sidewall layers 220A and 220B. A conducting material layer is deposited and patterned to form source and drain 204, 208 contacts. The gate electrode 206 may be formed at the same time or in a separate step if the gate electrode 206 is made from a different material than contacts 204, 208. As illustrated, the MOSFET of this embodiment is an N—N—N "enhancement type" MOSFET. Alternatively, a "depletion type" MOSFET may be made by forming source and drain regions in the base element 115A of the opposite conductivity type as the channel region 202.

Many electronic devices as Schottky diodes and MOSFETs are fabricated through advanced processing of a homogeneous high purity semiconductor template. HEMT templates differ though in that they include an epitaxial layer stack comprising a barrier layer, usually an AlGaN barrier layer. The AlGaN/GaN interface provides a natural 2DEG. By combining both templates on one partitioned substrate, an IC platform, with both two-terminal and HEMT based three terminal devices systems can be realized. The method, as exemplified by an HEMT device and a Schottky diode device formation, includes the following steps.

Figure 14D:
FIGS. 14d-f are schematic diagrams illustrating a method of making a hybrid circuit according to an embodiment.
Figure 14E:
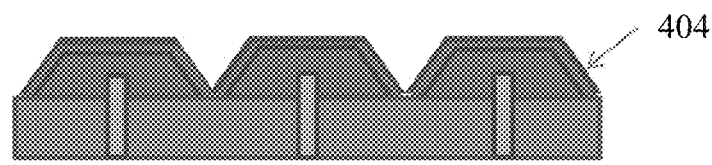

As shown in FIG. 14d, in a first growth step, the base elements 115A are formed as described previously. Then, in a second growth step, the epitaxial active device layer stack 402 comprising a barrier layer, usually an AlGaN barrier layer, is formed over the base elements 115A to form a portion of the HEMTs. Thereafter, in a third growth step, at least one high purity nitride semiconductor device layer 404 intended for the fabrication of the diode is formed over the stack 402 over all of the base elements 115A, as shown in FIG. 14e.

Figure 14F:
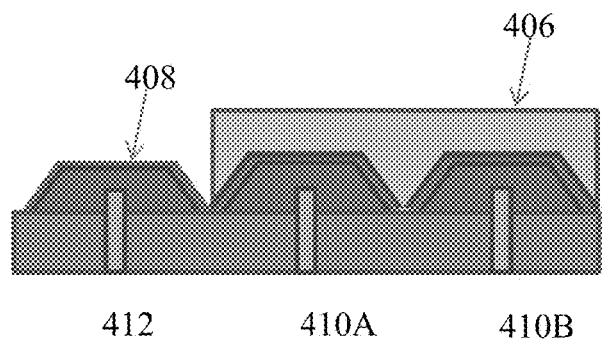

Then, an etch mask, such as a photoresist mask 406, is formed over the device layer 404 in the diode formation areas 410A, 410B (i.e., over the base elements 115A in areas 410A, 410B). The portions of the device layer 404 not covered by the etch mask 406 (i.e., exposed in the mask) located in the HEMT formation areas 412 (i.e., the base elements 115A in area 412) are removed by etching to expose the upper surface 408 of the stack 402 in area 412, as shown in FIG. 14f. The etch mask 406 is then removed and the electrodes and contacts are then formed to complete the diodes and the HEMTs in respective areas 410A, 410B and 412 over the same substrate.

Figure 14G:
FIGS. 14g-i are schematic diagrams illustrating a method of making a hybrid circuit according to an alternative embodiment.

Alternatively, the HEMT heterostructure growth steps may be done selectively without etching the high purity nitride semiconductor device layer 404 for fabrication of a diode. In this method, as shown in FIG. 14g, the epitaxial active device layer stack 402 comprising a barrier layer, usually an AlGaN barrier layer, is formed over the base elements 115A to form portions of the HEMTs (similar to the step shown in FIG. 14d).

Figure 14H:
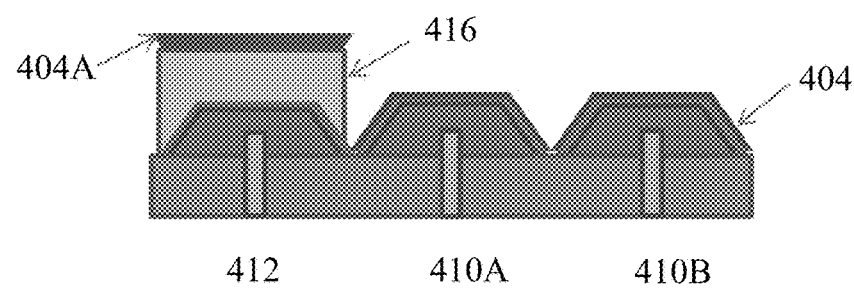

Then, a growth mask 416 is formed covering the base elements 115A in the HEMT areas 412 which are intended for HEMT formation, but exposing the base elements in the diode areas 410A, 410B, as shown in FIG. 14h. The growth mask 416 may be a hard mask, such as a dielectric, for example silicon oxide or silicon nitride, which retards or prevents selective III-nitride growth on its upper surface. Alternatively, the mask 416 may comprise a lift off mask, such as a resist lift off mask.

Figure 14I:
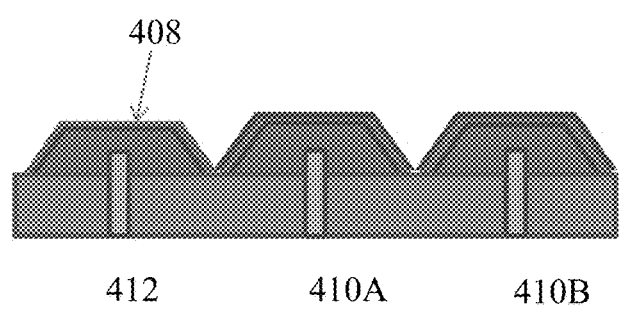

In the next growth step shown in FIG. 14i, the high purity nitride semiconductor device layer 404 for fabrication of a diode is then selectively formed on the base elements 115A in the diode areas 410A, 410B. However, the layer 404 is not formed on the growth mask 416 upper surface. Alternatively, if the mask 416 is a lift off mask, then a portion 404A of layer 404 is formed on the upper surface of the lift off mask 416.

The mask 416 is then removed to expose the upper surface 408 of the stack 402 in the HEMT areas 412. If the mask 416 is a lift off mask, then any device layer portion 404A that was located on the mask is lifted off and removed by the lift off process. The electrodes and contacts are then formed to complete the diodes and the HEMTs in respective areas 410A, 410B and 412 over the same substrate. This alternative method provides the advantage of a pre-fabricated substrate with HEMT and diode templates (i.e., base elements 115A in respective areas 412 and 410A/410B) in pre-defined configuration.

In both alternative methods, it may be advantageous to include a semi insulating layer in the growth step subsequent to the device layer comprising a heterostructure establishing a 2DEG, in order to insulate the schottky diode from the underlying 2DEG.

FIGS. 15A-15E illustrate an embodiment of a nanowire enabled power wafer. FIG. 15C is a plan view of a nanowire power wafer. As illustrated in FIG. 15C, the nanowire power wafer may be fabricated using an entire silicon substrate wafer 105. FIG. 15D is a close up of FIG. 15C and FIG. 15E is a close up of FIG. 15D. FIGS. 15D and 15E illustrate an embodiment in which individual nanowire power devices are fabricated in an array on the substrate 105. That is, the individual nanowire power devices are located in parallel rows and columns. FIG. 15A is a side cross sectional view of a single nanowire power device while FIG. 15B is a top view of the nanowire power device of FIG. 15A.

As discussed above, one aspect of embodiments of the invention result in fewer buffer layer related defects expanding into the device layers, through the filtering effect of nanowires. Thus, the addition of a buffer layer may be eliminated or, in the case of a silicon substrate, the thickness of the buffer layer (e.g. AlGaN/GaN, GaN/AlN, or AlN, buffer layer 112) may be reduced relative to buffer layers required by conventional bulk nitride layer growth methods. Alternatively, the conventional epitaxial buffer layers may be replaced with hard insulating materials such as alumina, diamond, or graphene to improve device insulation. In this manner, cost may be reduced relative to conventional methods. Further, improved device integration may be achieved.

Additionally, in embodiments with a buffer layer, the nanowire seed 110 limits the protrusion and creation of crystal dislocations from the nanowire/buffer interface in the nanowire. The result is dislocation free nanowires. However the nanowire growth conditions, such as taught in U.S. Pat. No. 7,829,443, may result in nanowires with point defects, such as impurities, vacancies, and stoichiometric irregularities.

Thus, as discussed above, protruding nanowires 110 may be used as seeds for the formation of high quality base elements 115A, such as the nitride semiconductor islands or mesas 115A shown in FIGS. 15A-15E. The nitride semiconductor islands or mesas 115A may be grown under growth conditions such as those used for the growth of high purity GaN material discussed herein. Further, the homogeneity of the nitride semiconductor islands 115A is controlled by the length of the nanowires 110. With this embodiment, high purity, low defect (e.g. low dislocation density) GaN islands or mesas may be fabricated on silicon substrates 105.

Because this embodiment provides a low threading dislocation density transfer from the nanowire/buffer interface, nanowire electronic devices can be fabricated with higher operating voltage and higher reliability. Also, by virtue of the low density of threading dislocations, superior semi-insulating layers can be grown on the nanowire and work as a close template for electronics devices. This is further enabled by the non-conventional use of only top contacts on the devices, as shown for example in FIGS. 13 and 14, so that the nanowire 110 and/or the base element 115A are not included in the active portion of the device, such as the electronic circuit. Thus, preferably, each base element mesa 115A comprises an insulating or semi-insulating mesa, where the mesa and the nanowire 110 are not part of an active device region of the device, each mesa and nanowire are not electrically connected to an outside circuit, and each mesa is not electrically connected to other mesas.

Further, the method allows the use of thin AlN, $Al_2O_3$, graphene, or diamond film buffer layers 112 rather than conventional thick epilayers. Additionally, the use of thin AlN or diamond film buffer layers provides improved device to device insulation and reduced or no wafer bow. This embodiment, as all of the embodiments discussed above and below, has improved material quality marked by defect free template growth and low background impurity level from radial growth. Further, the embodiments disclosed herein do not require a conductive buffer layer, rendering the buffer layer growth step optional. The device disclosed herein also has improved RF properties relative to conventional devices. Additionally, with the methods disclosed herein, the c-plane of GaN can be used to fabricate high mobility transistors.

Enhanced material quality of the device layers has direct implications on device breakdown voltage and decreased base element 115A size. This in turn results in improved device density and design flexibility of the devices. The electrode spacing on the device may also be decreased due to the increased breakdown voltage and decreased defect density. For example, electrode spacing of 10-50 µm are common in power HEMTs and HFETs. An additional way to improve breakdown voltage and device width minimization is to form the base element 115A having sloped sidewalls, as shown in FIGS. 12-15, where the electrodes are, at least partly, positioned on the sloped facets, facing away from each other, as shown in FIGS. 13*d* and 14*a*-14*c*, and thus decreasing electrical field between electrodes and risk for breakdown through discharge at high voltage.

In addition, enhanced material quality of the device layers has direct implications on device electron mobility, and hence device conductivity, current capacity, switching speed and power efficiency of the device. This is especially important for HEMTs where conditions for electron mobility in the 2DEG are improved by quantum confinement effects and lack of doping atoms. In spite of this, room temperature mobility remains below 2000 $cm^2 V^{-1} \cdot s^{-1}$, attributed to high defect density of standard GaN. Higher current capacity translates mainly to lower gate width, and the need for lower number of templates in parallel for high power devices.

Figure 16A:
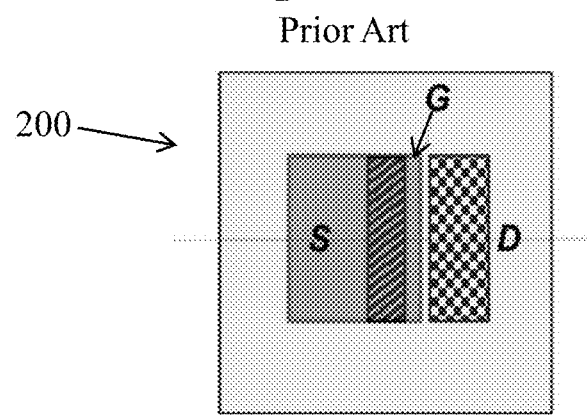
FIGS. 16A-16B illustrate a prior art planar high electron mobility transistor (HEMT).
Figure 16B:
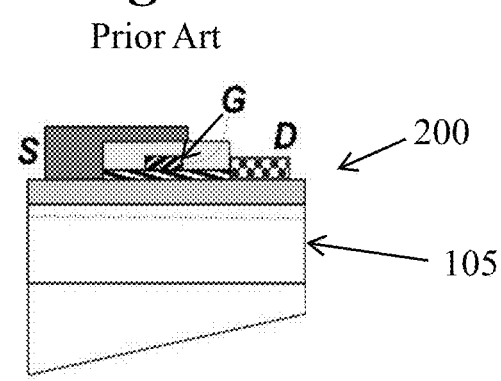

FIG. 16A (top schematic view) and 16B (side cross sectional schematic view) illustrate a conventional planar high electron mobility transistor 200 (HEMT). The HEMT 200 includes a source S, a drain D and a gate G electrodes. Preferably, if the HEMTs are to be used in on-chip circuitry, then the HEMT devices 200 should be electrically separated with shallow trench isolation (STI). In the STI process, a pattern of shallow trenches is etched prior to transistor fabrication. The trenches are then filled with a dielectric material, thereby electrically isolating regions on either side of the trenches. Electrically isolated devices may then be fabricated in the region between the trenches. The STI process is widely used in silicon CMOS fabrication. However, the STI process is inapposite for GaN based devices, as the process tends to be destructive and expensive. The chemical etchants for GaN are not efficient and sufficiently reliably semi-insulating planar GaN with a sufficiently low conductivity is hard to achieve, meaning that deep trenches are needed.

In contrast, as described above, a partitioned wafer or support, providing insulation between individual, separated mesas 115A acting as templates for electronic devices, can be produced with the embodiment methods described herein. This partitioned power wafer provides the possibility for on-chip small systems and circuits without STI for power electronics applications and for electronics in general.

Figure 17A:
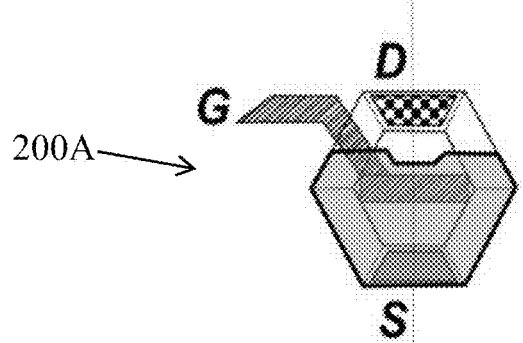
FIGS. 17A-17B illustrate a HEMT according to an embodiment.
Figure 17B:
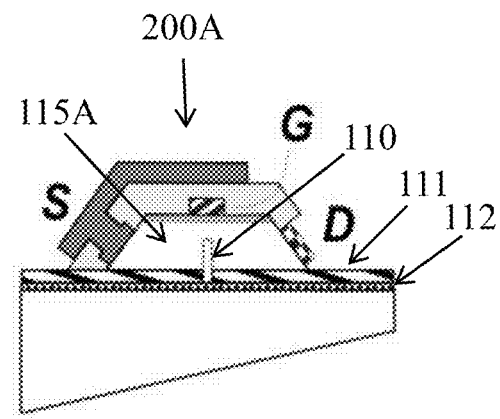

FIG. 17A (top schematic view) and 17B (side cross sectional schematic view) illustrate a HEMT 200A according to an embodiment. The HEMT 200A channel has a generally hexagonal shape of the island 115A when viewed from above. Isolation is provided by using a thin AlN or diamond film buffer layer 112 and a dielectric growth mask 111 made of, for example, $Al_2O_3$, $SiO_2$, $Si_3N_4$ or another insulating layer. In an embodiment, one HEMT is provided per island 115. In an alternative embodiment, the HEMT 200A includes a silicon substrate and GaN nanowires.

FIGS. 18A-18F illustrate top schematic views (18A, 18C, 18E) and respective side cross sectional schematic views (18B, 18D, 18F) of alternative HEMT embodiments. The embodiment illustrated in FIGS. 18C and 18D include a large field plate 201 which covers the source and gate electrodes S, G and may increase the efficiency of the HEMT. The field plate 201 is electrically connected to the source electrode S but is insulated from the gate electrode G by insulating layer 301. The embodiment illustrated in FIGS. 18E and 18F includes a smaller field plate 201 that covers the gate electrode G but not the source electrode S. The field plate 201 is electrically connected to the gate electrode G but is insulated from the source electrode S by insulating layer 301. The embodiment illustrated in FIGS. 18A and 18B do not include a field plate 201.

Figure 19C:
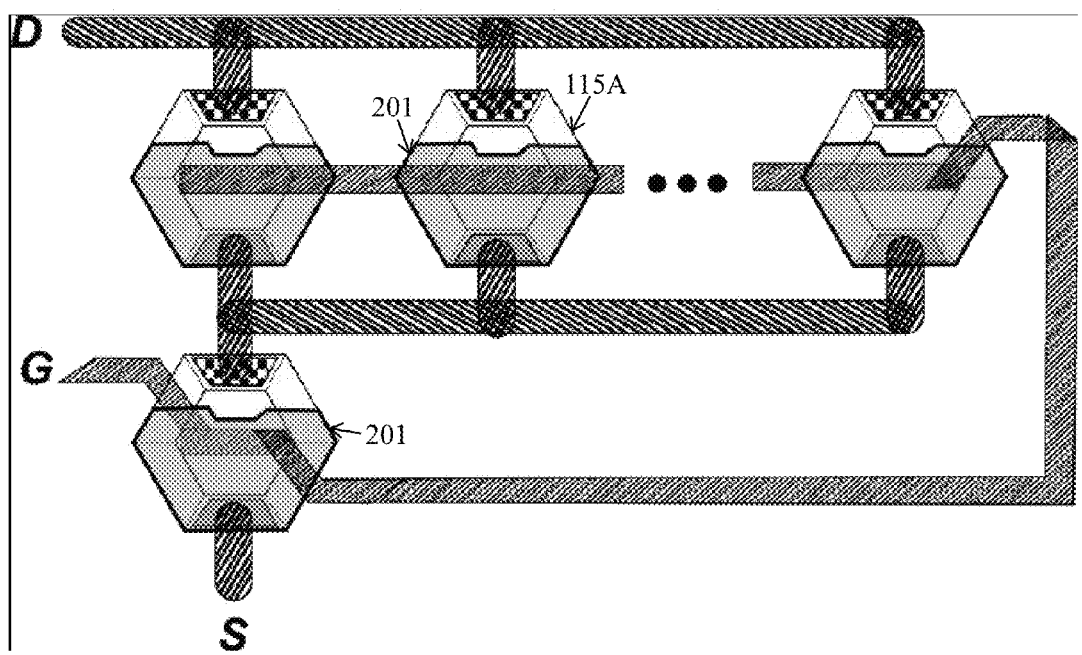
FIG. 19C illustrates an embodiment with HEMTs in a parallel and cascade configuration.

FIG. 19A is a top schematic view of an embodiment with two transistors 200A, and 200B in a cascode configuration 302. This may be two HEMTs, or a HEMT, 200A, above a normally off MOSFET, MESFET or JFET, 200B. The latter configuration enables normally-off circuits to be made, which is hard with HEMTs only, being normally-on. FIG. 19B illustrates an equivalent circuit of the cascoded transistors illustrated in FIG. 19A (the first source electrode S1 is connected to the second gate electrode G2 and the first drain D1 is connected to the second source S1). Alternatively, multiple HEMTs can be connected in parallel. Further, multiple HEMTs can be connected with parallel and cascode coupling in the same device, as shown in FIG. 19C.

FIGS. 20A-20C illustrate alternative embodiments in which multiple HEMTs 200A are connected with a common gate line GL. That is, the gate electrodes G of the HEMTs are electrically connected. As illustrated, the embodiment of FIG. 20A includes four HEMTs 200A of the embodiment illustrated in FIGS. 18A and 18B. However, a fewer or greater number of HEMTs may be connected. The embodiment illustrated in FIG. 20B, includes HEMTs of the embodiment illustrated in FIGS. 18C and 18D while the embodiment illustrated in FIG. 20C includes HEMTs of the embodiment illustrated in FIGS. 18E and 18F.

FIG. 21A illustrates another embodiment. In this embodiment, the HEMTs are configured such that the gate electrodes G are connected with a common gate line GL, the drain electrodes D are connected with a common drain line DL and the source electrodes S are connected with a common source line SL. FIG. 21B illustrates the equivalent circuit for the device illustrated in FIG. 21A. The individual HEMTs 200A may or may not include field plates 201. That is, the HEMTs may include large field plates 201, small field plates 201 or no field plates as illustrated in FIGS. 18A-18G.

FIG. 22H illustrates a DC to AC power inverter 210 according to an embodiment and FIGS. 22A-22G illustrate the components. The device illustrated in FIG. 22H is a three phase inverter which includes three single phase inverter circuits Ph1, Ph2, Ph3. The power inverter 210 includes both cascode and parallel coupling. The single phase inverter circuits Ph1, Ph2, Ph3 of the power inverter 210 include nanowire diodes 306 as illustrated in FIGS. 22A and 22B and nanowire HEMTs 200A as illustrated in FIGS. 22E and 22F. In an alternative embodiment, the power inverter 210 may include nanowire HEMTs 200A as illustrated in FIGS. 22C and 22D with larger field plates 201. FIG. 22G illustrates a plurality of diodes 306 connected in series (i.e., "source" S to "drain" D).

The method according to the embodiments of the invention is applicable also for structures comprising more than two periodic table elements, for example ternary compositions such as InGaN. Strain is a serious problem for making high In content InGaN/GaN core shell structures as illustrated in FIG. 5a, wherein a GaN nanowire 510 is enclosed by the shell InGaN layer 515. Using InGaN also in the nanowire 511 would reduce the strain in the shell InGaN layer, as illustrated in FIG. 5b. However, InGaN is a thermally unstable material and a NH$_3$ flow is needed is to prevent the dissociation of In—N bonds. Hence, the prior art methods utilizing disrupted NH$_3$ flows may not be suitable for producing InGaN nanowires. In the NH$_3$ interruption step at InGaN growth temperatures it implies that In—N bonds dissociate and In can desorb from the crystal. Employing continuous nanowire growth as afforded by the present invention supports growth of higher In content InGaN nanowires.

A conventional MOCVD or MOVPE, apparatus may not be optimal for carrying out the method according to the embodiment comprising a nanowire growth phase and an immediate subsequent planar growth phase. Due to technical limitations in the gas supply systems, the same gas supply systems may not be able to provide both the low V/III-ratio and the high V/III-ratio associated with the nanowire growth phase and the planar growth phase, respectively, with required accuracy. A growth apparatus according to one embodiment of the invention, schematically illustrated in FIG. 6 comprises a growth chamber 610, wherein the sample 615 is placed. A III-supply system 622 comprises a III-source 620 and a mass flow controller (MFC). The V-supply system comprises a V-source 630 connected to a low source flow rate V-supply line 634 comprising a low flow rate MFC 633, and separate high source flow rate V-supply line 632 comprising a high flow rate MFC 631. The low flow rate MFC 633 is adapted to handle the low flow rates of for example NH$_3$ associated with the nanowire growth phase, and the high flow rate MFC 631 is adapted to handle the high flow rates associated with the planar growth phase. By switching between the two separate V-supply lines then going from the nanowire growth phase to the planar growth phase a rapid change can be made with the required accuracy of the flow rates in the two different phases. The apparatus may of course be provided with more separate supply lines if the required flow rates are not possible to obtain with two MFCs.

The applicability of the method of the invention is demonstrated by the examples below, which should be regarded as non-limiting examples.

Figure 2B:
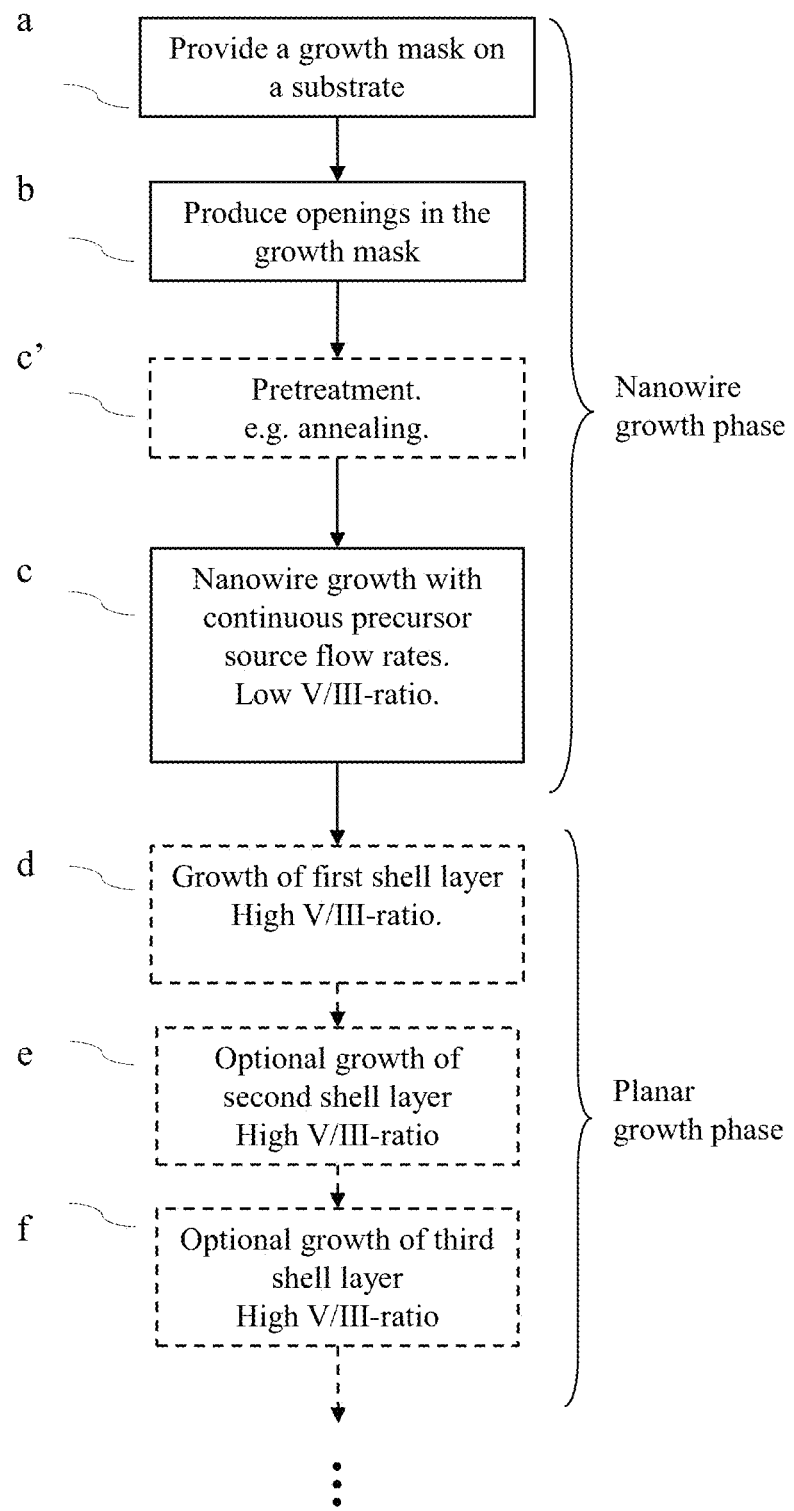

FIGS. 2a-2c may illustrate the fabrication sequences of GaN nanowires by selective area growth. GaN epitaxial films on sapphire, SiC or Si and even self-supporting GaN are used as the starting substrates, on which a layer of SiN$_x$ (30 nm in thickness) was deposited by PECVD (a). Following this, arrays of dot-patterned GaN openings (around 100 nm in diameter) were made by EBL and RIE (b). The pitch between the openings was ranged as 0.5-3.2 µm. Then, the as-processed samples were inserted into a home-made, horizontal MOCVD chamber to grow GaN nanowires (c). The growth process comprises an initial phase wherein, temperature was ramped up to the growth zone of 900-1200° C. within 5 min with a high NH$_3$ flow rate of 75 sccm. The substrate is annealed for 1 min at growth temperature. In a subsequent nanowire growth phase the NH$_3$ flow rate was reduced to 3.0-0.2 sccm to start the growth with introducing TMG (trimethylgallium) into the chamber. Low TMG flow rate was used through this work, between 0.12 and 1.2 µmol/min.

According to the embodiments of the invention, verified in experiments, the NH$_3$ flow rate is the crucial factor controlling the growth forms from the openings. FIGS. 7a-7b show the SEM images of the sample grown with the NH$_3$ flow rate of 3.0 sccm. From the top-view image FIG. 7a, it can be seen that the selective growth from the openings, which is the same as what was reported. The point needed to be specified here is that the lateral size after growth is larger than 1.0 µm which is much larger than the openings size of around 100 nm. Thus, the lateral growth after GaN had grown out of openings is substantial. FIG. 7b shows the SEM image taken by tilting the sample by 35°, which clearly presents that what were obtained are pyramids, not wires. The pyramids are delimited by six equivalent (1101) planes. The dangling bonds density of (1101) plane is 16.0/nm$^2$, which is higher than that of (1100) plane (12.1/nm$^2$) and (0001) plane (11.4/nm$^2$) [3]. From this point of view, the planes of (1100) and (0001) are expected to appear after GaN grows out of the openings. But, FIG. 2 shows the opposite. So, a possible explanation is that (1101) plane has the N-polarization, which makes it stable when NH$_3$ flow rate is high. Based on this, the flow rate of 3 sccm for NH$_3$ is actually still high for growing GaN wires faceted by (1100) plane. FIGS. 8a-8b show the SEM characterizations of the sample grown under NH$_3$ flow rate of 1.0 sccm. The top-view image FIG. 8a is similar as FIG. 7a. But, the 35° tilted image, FIG. 8b is different, that is vertical facets of (1100) plane begin to appear underneath the pyramids caps.

This is promising and indicates that N-polarized (1101) planes begin to be incapable of delimiting the growth forms of pyramids. Despite this, the lateral size is still much larger than the one of openings, which is the same as shown FIG. 7.

FIGS. 9a-9b show the growth results with reducing NH$_3$ flow rate further to 0.5 sccm. Both top-view (a) and 35° tilted (b) images indicate the size shrinking in lateral direction, although they are still larger than the openings size of around 100 nm. The tilted image FIG. 9b also shows the vertical facets. As NH$_3$ flow rate was lowered to 0.2 sccm, true GaN nanowires began to be synthesized as shown in FIGS. 10a-10c, wherein (a) is a top-view; (b) and (c) are 45° tilted. Although there are some crystallites larger than 100 nm, but most of the openings evolve into wires which have the diameter in 100 nm, same as the openings size. So, the lateral growth is also in a good control when NH$_3$ flow rate is 0.2 sccm. As for the vapor-phase growth, the degree of supersaturation determines the prevailing growth morphology, that is: a low supersaturation is required for nanowire growth whereas a medium supersaturation supports bulk crystal growth. At high supersaturation, powders are formed by the nucleation in vapor phase. According to this, it's reasonable to say that reducing NH$_3$ flow rate to 0.2 sccm lowers the supersaturation effectively which confines the lateral growth and makes the growth happen only in the axial direction. Here, all of the growth has been conducted with keeping TMG and NH$_3$ flowing into the chamber simultaneously and continuously during the whole growth process. However, work reported in prior art seems to indicate that pulsed growth mode was necessary to get nanowire growth. Based on the result presented here it is clear that nanowire growth can be achieved with continuous source flow rate. In order to fabricate the GaN nanowires the NH$_3$ flow rate should be adjusted so that a low supersaturation is achieved, or alternatively described; to achieve migration enhanced growth.

Cp$_2$Mg has been shown to enhance vertical side wall facet formation. In FIGS. 11a-c, relating to table 1, it is illustrated that doping sources, as Cp$_2$Mg, potentially, can stabilize the nanowire growth conditions by this effect. Also, it is further shown that by increasing supersaturation/NH$_3$ flow rate pyramidal growth can be re-established. This can be utilized to in a lateral growth phase provide lateral growth of the nanowires.

TABLE 1

| Growth nr | NH$_3$-flow [sccm] | Cp$_2$Mg-flow [sccm] | Comments |
|---|---|---|---|
| a | 1 | — | No doping |
| b | 1 | 70 | Perfect wires |
| c | 10 | 70 | Increasing NH$_3$-flow to re-establish pyramidal growth |

Nanowires fabricated by the method of the invention can be utilized in a wide range of device, for example diodes, transistors, and other power electronic devices. Nitride based electronics are of special interest in high voltage and high temperature applications.

In conclusion, through decreasing NH$_3$ flow rate, GaN nanowires can be fabricated by MOCVD using selective area growth from the GaN openings by controlling the supersaturation. In the results presented it is shown that pulsed growth is not a necessary method but that reducing NH$_3$ flow rate sufficiently can also produce nanowires.

The method of the invention has been described with GaN, NH$_3$ and TMG as non limiting examples. The skilled person appreciate that the principles of the method is applicable to the growth of other semiconductor nitride based nanowires, for example comprising Indium or Aluminum such as AlInGaN. III-NAs, and III-NP. NH$_3$ is a convenient and well established nitrogen source, but other sources are known and could be utilized, for example tert-butylamine N(C$_4$H$_9$)H$_2$, 1,1-Dimethylhydrazine (CH$_3$)$_2$NNH$_2$, and tert-butyl hydrazine (CH$_3$)$_3$CNHNH$_2$. Depending of choice of the III-V semiconductor different sources are available. Different sources will lead to different appropriate values of the flow rates in order to achieve the low supersaturation, and hence the V/III-ratio will need to be adjusted accordingly. Such adjustments can be made by the skilled person given the above teaching.

The method and the device have been described with its growth substrate 105 remaining in the final device. The skilled person appreciate that the all or part of the growth substrate 105 may be removed or replaced by another material (e.g., a handle substrate which is attached above or below the mesa 115A). Handle substrate materials include heat conductive material substrates, for example graphene or metal, such as Cu or Al, as long as electrical insulation is retained.

The entire contents of U.S. patent application Ser. No. 12/308,249, filed Dec. 11, 2008, now U.S. Pat. No. 7,829,443, are hereby incorporated by reference.

What is claimed is:

1. A method of fabricating a nitride semiconductor wafer comprising the steps of:
    forming nanowires without threading dislocations on a substrate surface;
    forming nitride semiconductor nanostructures without threading dislocations by growing respective nitride semiconductor volume elements from the nanowires;
    planarizing the nitride semiconductor volume elements of the nitride semiconductor nanostructures to form separated individual mesas having exposed planar c-plane upper surfaces; and
    epitaxially growing a respective planar stoichiometric nitride semiconductor layer on the planar c-plane upper surfaces of the separated individual mesas, such that at least 90% of the planar nitride semiconductor layers have no threading dislocations and a flat c-plane surface.

2. The method of claim 1, wherein the step of forming nitride semiconductor nanostructures comprises:
    providing a growth mask with openings on the substrate surface; and
    forming the nanowires by selectively growing an array of strain-relaxed nitride semiconductor nanowires from the apertures, wherein threading dislocations are rejected from the nanowire in an early stage of nanowire growth.

3. The method of claim 2, wherein the nitride semiconductor volume element comprises a GaN volume element grown at conditions similar to planar GaN.

4. The method according to claim 1, wherein the step of planarization is made through temperature assisted anisotropic etching.

5. The method according to claim 1, wherein the step of planarization is made in situ.

6. The method according to claim 1, wherein 90-99% of the at least planar stoichiometric nitride semiconductor layers do not have threading dislocations.

7. The method of claim 2, wherein the substrate comprises a buffer layer and the nanowire growth limits the protrusion of crystal dislocations from the nanowire/buffer layer interface.

8. The method of claim 7, wherein the buffer layer comprises GaN or AlGaN.

9. The method of claim 7, wherein the buffer layer comprise a thin film of AlN, Al$_2$O$_3$, graphene or diamond.

10. The method of claim 2, wherein the substrate provides electrical insulation between the separated individual mesas, resulting in a partitioned wafer.

11. The method of claim 1, wherein at least a part of the substrate is removed and replaced by a handle substrate.

12. The method of claim 11, wherein the handle substrate comprise heat conductive material.

13. The method of claim 12, wherein the conductive material comprises Al, Cu or graphene.

14. The method of claim 1, wherein the respective nitride semiconductor volume elements are grown from a side of the nanowires.

15. The method of claim 1, wherein the planar stoichiometric nitride semiconductor layers are also grown on pyramidal side facets of the separated individual mesas.

* * * * *